United States Patent
Li et al.

(10) Patent No.: US 11,817,406 B2
(45) Date of Patent: Nov. 14, 2023

(54) SEMICONDUCTOR DIE EMPLOYING REPURPOSED SEED LAYER FOR FORMING ADDITIONAL SIGNAL PATHS TO BACK END-OF-LINE (BEOL) STRUCTURE, AND RELATED INTEGRATED CIRCUIT (IC) PACKAGES AND FABRICATION METHODS

(71) Applicant: QUALCOMM Incorporated, San Diego, CA (US)

(72) Inventors: Yue Li, San Diego, CA (US);
Durodami Lisk, San Diego, CA (US);
Jinying Sun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 127 days.

(21) Appl. No.: 17/483,325

(22) Filed: Sep. 23, 2021

(65) Prior Publication Data
US 2023/0090181 A1 Mar. 23, 2023

(51) Int. Cl.
*H01L 25/065* (2023.01)
*H01L 23/00* (2006.01)

(52) U.S. Cl.
CPC .............. *H01L 24/05* (2013.01); *H01L 24/03* (2013.01); *H01L 24/11* (2013.01); *H01L 24/13* (2013.01);
(Continued)

(58) Field of Classification Search
CPC ...................................................... H01L 24/05
See application file for complete search history.

(56) References Cited

U.S. PATENT DOCUMENTS 7,859,122 B2 * 12/2010 Daubenspeck ......... H01L 24/03
257/784
9,859,235 B2 * 1/2018 Liu ..................... H01L 23/3157
(Continued)

FOREIGN PATENT DOCUMENTS

DE 112019005745 T5 7/2021

OTHER PUBLICATIONS

Invitation to Pay Additional Fees and Partial International Search for International Patent Application No. PCT/US2022/075315, dated Dec. 23, 2022, 19 pages.
(Continued)

*Primary Examiner* — William A Harriston
(74) *Attorney, Agent, or Firm* — Withrow & Terranova, PLLC

(57) ABSTRACT

A semiconductor die ("die") employing repurposed seed layer for forming additional signal paths to a back end-of-line (BEOL) structure of the die, and related integrated circuit (IC) packages and fabrication methods. A seed layer is repurposed that was disposed adjacent the BEOL interconnect structure to couple an under bump metallization (UBM) interconnect without a coupled interconnect bump thus forming an unraised interconnect bump, to a UBM interconnect that has a raised interconnect bump. To couple the unraised interconnect bump to the raised interconnect bump, the seed layer is selectively removed during fabrication to leave a portion of the seed layer repurposed that couples the UBM interconnect that does not have an interconnect bump to the UBM interconnect that has a raised interconnect bump. Additional routing paths can be provided between raised interconnect bumps to the BEOL interconnect structure through coupling of UBM interconnects to an unraised interconnect bump.

29 Claims, 17 Drawing Sheets

(52) U.S. Cl.
CPC .......... *H01L 24/16* (2013.01); *H01L 25/0655* (2013.01); *H01L 25/0657* (2013.01); *H01L 2224/0231* (2013.01); *H01L 2224/02331* (2013.01); *H01L 2224/0401* (2013.01); *H01L 2224/05082* (2013.01); *H01L 2224/16146* (2013.01); *H01L 2224/16227* (2013.01); *H01L 2225/0652* (2013.01); *H01L 2225/06517* (2013.01)

(56) References Cited

U.S. PATENT DOCUMENTS

| | | | | |
|---|---|---|---|---|
| 9,960,106 | B2* | 5/2018 | Chen | H01L 21/568 |
| RE48,421 | E | 2/2021 | Jung et al. | |
| 2003/0127748 | A1* | 7/2003 | Fang | H01L 23/3128 |
| | | | | 257/E21.511 |
| 2004/0056351 | A1* | 3/2004 | Wu | H01L 24/11 |
| | | | | 257/737 |
| 2005/0017343 | A1* | 1/2005 | Kwon | H01L 23/3114 |
| | | | | 257/E23.021 |
| 2010/0187687 | A1* | 7/2010 | Liu | H01L 24/05 |
| | | | | 257/738 |
| 2012/0112314 | A1* | 5/2012 | Jou | H01L 28/60 |
| | | | | 257/532 |
| 2013/0320522 | A1* | 12/2013 | Lai | H01L 23/3192 |
| | | | | 257/E21.585 |
| 2021/0066176 | A1 | 3/2021 | Shinkai | |
| 2021/0242836 | A1 | 8/2021 | Sato et al. | |
| 2021/0375675 | A1* | 12/2021 | Cheng | H01L 24/05 |
| 2021/0375742 | A1 | 12/2021 | Li et al. | |
| 2022/0302042 | A1* | 9/2022 | Reber | H01L 21/78 |

OTHER PUBLICATIONS

International Search Report and Written Opinion for International Patent Application No. PCT/US2022/075315, dated Feb. 20, 2023, 29 pages.

* cited by examiner

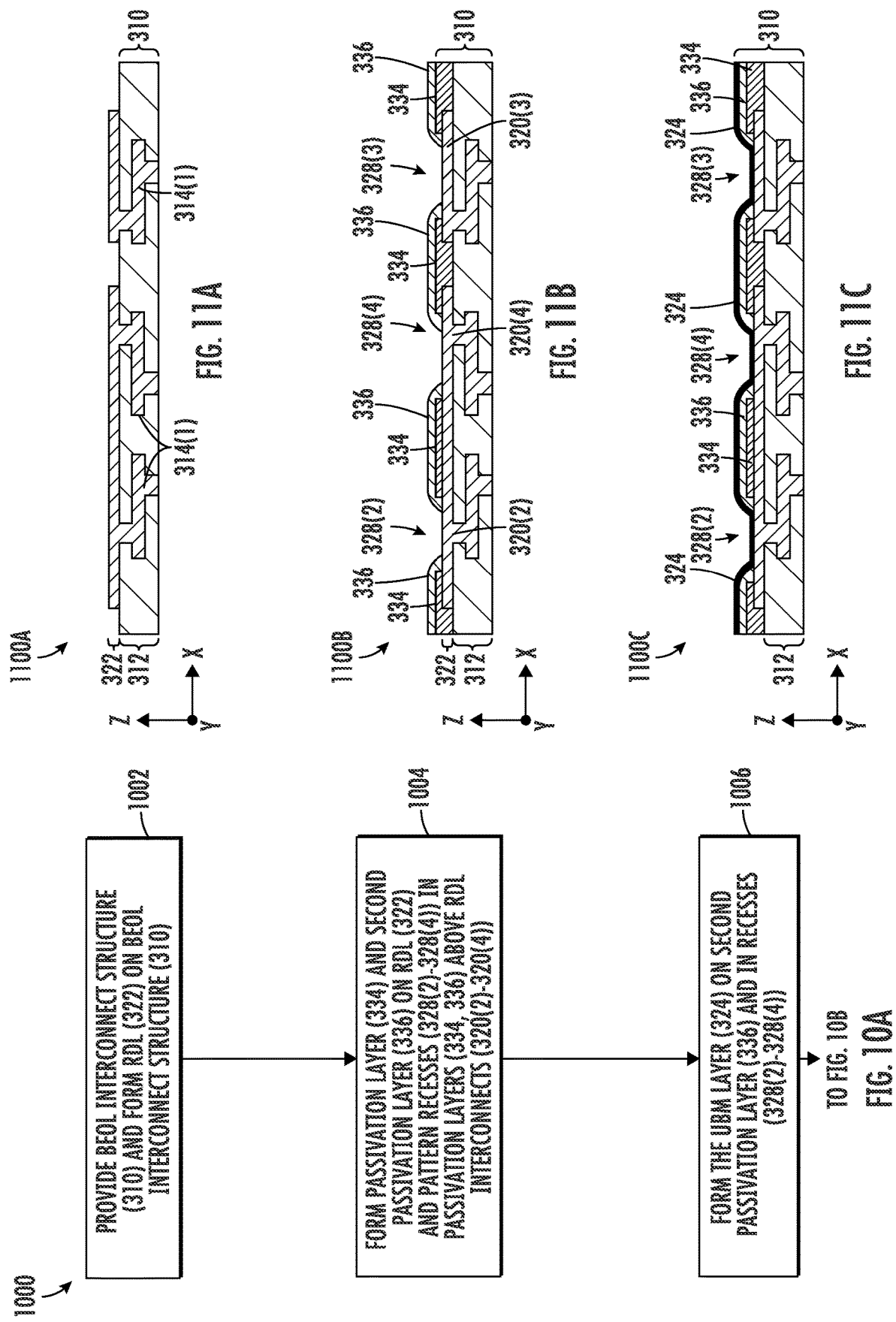

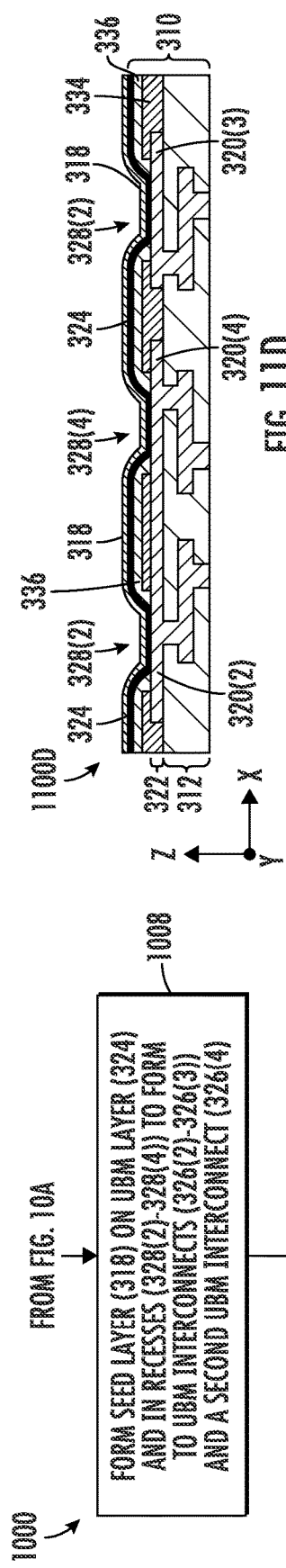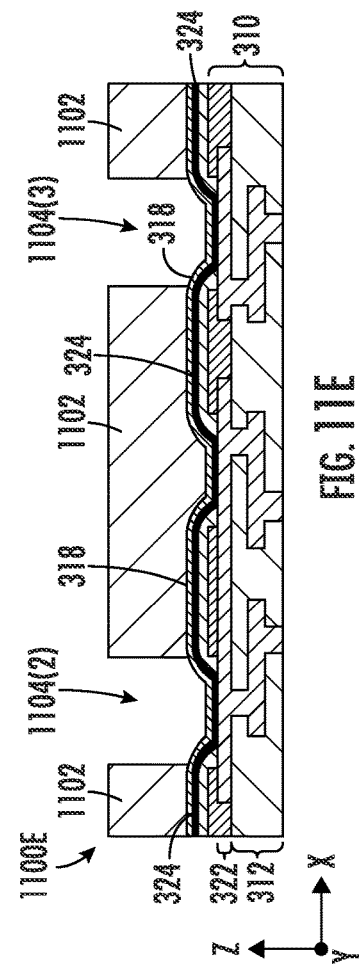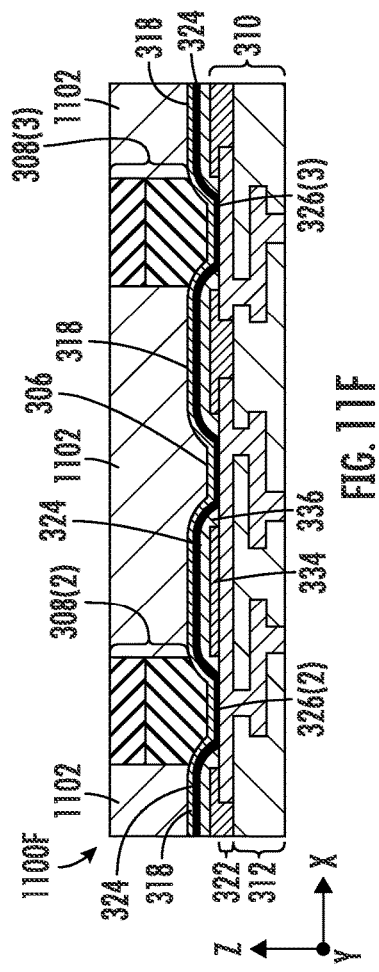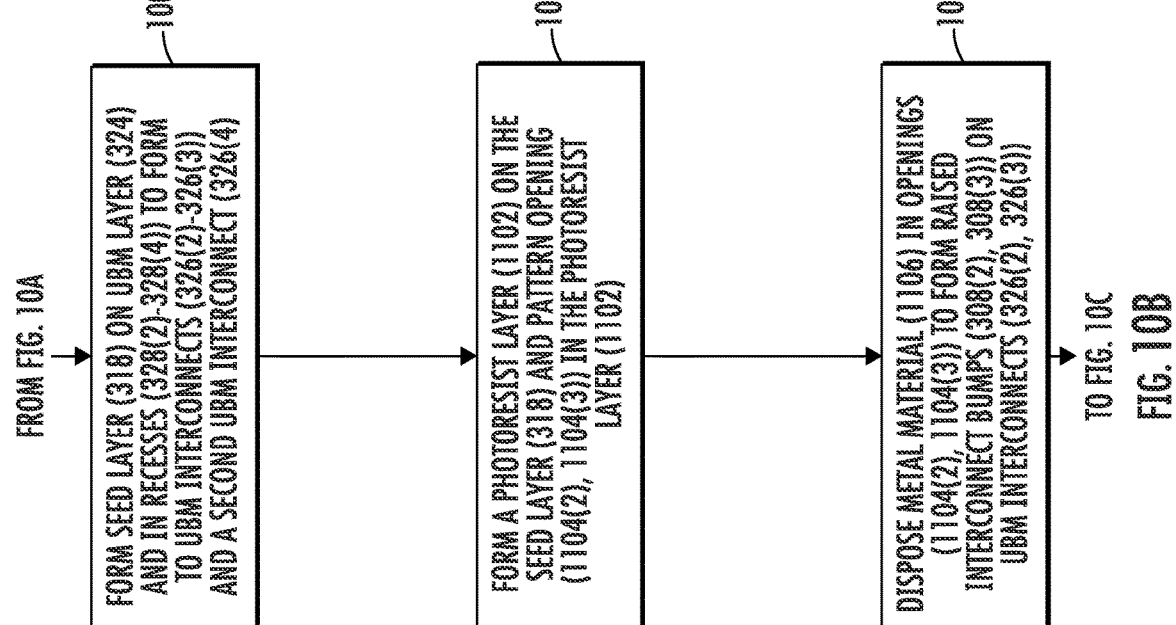

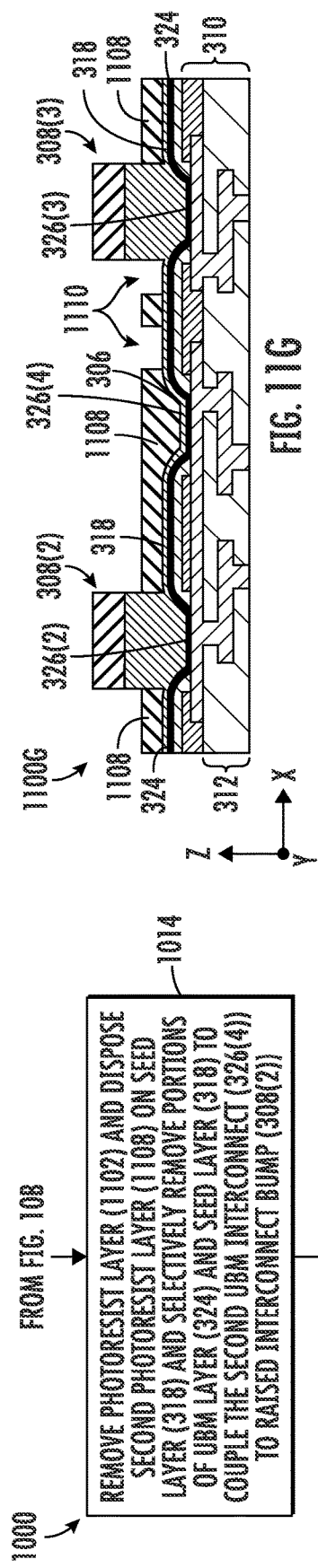
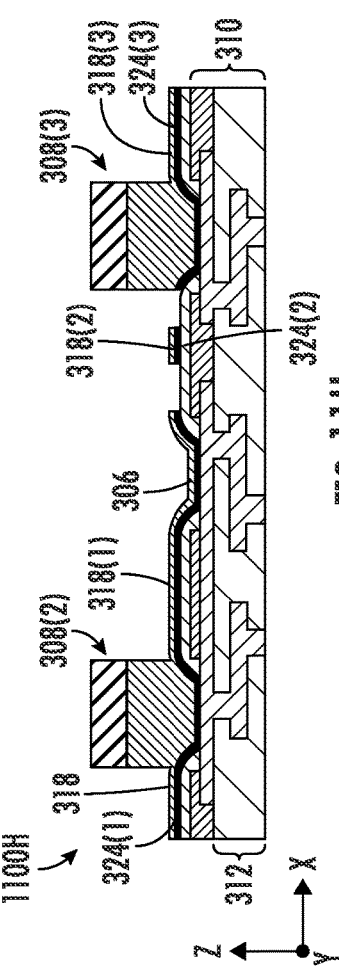
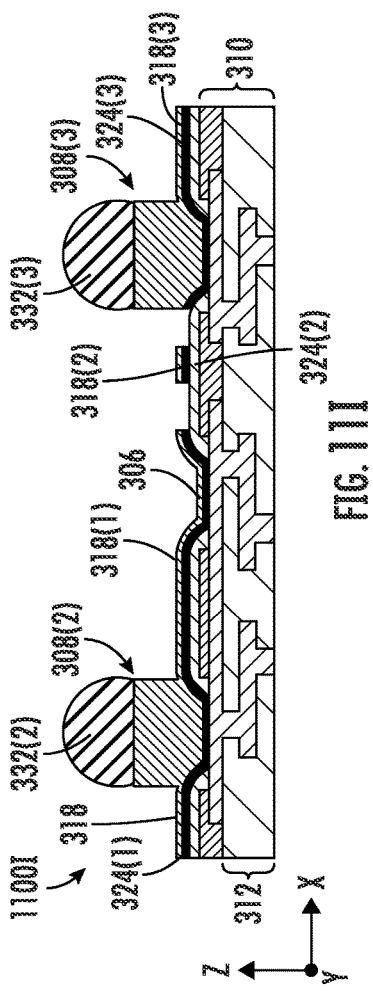

SEMICONDUCTOR DIE EMPLOYING REPURPOSED SEED LAYER FOR FORMING ADDITIONAL SIGNAL PATHS TO BACK END-OF-LINE (BEOL) STRUCTURE, AND RELATED INTEGRATED CIRCUIT (IC) PACKAGES AND FABRICATION METHODS

BACKGROUND

I. Field of the Disclosure

The field of the disclosure relates to integrated circuit (IC) packages that include one or more semiconductor dies ("dies") attached to a package substrate, and more particularly to interconnect bump designs in the IC package for electrically coupling the dies to the package substrate.

II. Background

Integrated circuits (ICs) are the cornerstone of electronic devices. ICs are typically packaged in an IC package, also called a "semiconductor package" or "chip package." The IC packages can be included in hand-held, battery-powered electronic devices, for example, where reduced package size and reduced power consumption is particularly important. A conventional IC package includes a package substrate and one or more IC chips or other electronic modules mounted to the package substrate to provide electrical connectivity to the IC chips. For example, an IC chip in an IC package may be a system-on-a chip (SoC), an application processor, or a power management IC. The semiconductor dies ("dies") of the IC chips are electrically coupled to the package substrate through metal interconnects such as in the form of solder bumps or copper pillars, also known as "interconnect bumps" or just "bumps." Metal traces or lines in metallization layers in the package substrate are coupled to the interconnect bumps to route electrical signals external to the IC package as well as to other coupled dies in the IC package. Some metal traces in the package substrate are dedicated for delivering power as part of a power distribution network (PDN) in an IC package.

The pitch of the interconnect bumps coupling the dies to the package substrate influences the performance of the circuits in the dies. With a larger interconnect bump pitch, power may not be delivered effectively close to circuits in the dies of the IC package, thereby increasing signal resistance and current-resistance (IR) drop. Thus, it is desired to reduce the interconnect bump pitch to provide for power delivery to be as close as possible to circuits in the dies of an IC package for increased circuit performance. However, reducing interconnect bump pitch can be challenging in IC package designs. The interconnect bump pitch affects many parameters in the package substrate including trace width and vertical interconnect access (via) pad size. Reducing interconnect bump pitch in an IC package is sometimes not possible given package fabrication process limitations. Even when realization of reduced interconnect bump pitch in an IC package is possible within fabrication process limitations, reduced interconnect bump pitch can cause a reduction in yield as well as increased assembly costs.

SUMMARY OF THE DISCLOSURE

Aspects disclosed in the detailed description include a semiconductor die ("die") employing a repurposed seed layer for forming additional signal paths to a back end-of-line (BEOL) structure of the die. Related integrated circuit (IC) packages and fabrication methods are also disclosed. The die includes a BEOL interconnect structure that includes one or more metallization layers. Each metallization layer includes metal interconnects to provide signal routing paths to devices formed in an active semiconductor layer of the die. The die also includes a plurality of under bump metallization (UBM) interconnects, also known as just UBM. The UBM interconnects are coupled to metal interconnects in an upper metallization layer of the BEOL interconnect structure to facilitate the formation of raised interconnect bumps (e.g., solder bumps, metal pillars). The raised interconnect bumps provide an electrical interconnect interface between the die and a package substrate of the IC package for signal routing. The UBM interconnects are formed by a metal seed layer (also known as a "bump distribution layer" (BDL)) disposed in recesses formed in a passivation layer disposed on the BEOL interconnect structure that exposes the metal interconnects in the upper metallization layer of the BEOL interconnect structure. The raised interconnect bumps are formed in contact with UBM interconnects. It may be desired to decrease the raised interconnect bump pitch for an increased die connection density. The raised interconnect bump pitch affects the routing distance of signals between the die and the package substate, which can increase routing resistance and inductance. This can, for example, increase current-resistance (IR) drop for power signals routed through the raised interconnect bumps. Multiple raised interconnect bumps can be consumed and coupled together as a node to reduce resistance of a particular die interconnection, but this consumes additional interconnect bumps that could otherwise be used for other signal routing. Even consumption of multiple raised interconnect bumps may not provide the desired resistance reduction.

Fabrication methods allow the recesses in the BEOL interconnect structure, where the UBM interconnects are formed, to be of a smaller pitch than the minimum pitch of the raised interconnect bumps. The formation of these recesses is not subject to the same fabrication limitations as the formation of the raised interconnect bumps relating to minimum pitch. Thus, in exemplary aspects, to provide for additional signal paths to the die than would otherwise be limited by the minimum raised interconnect bump pitch of its IC package, the seed layer that is disposed in recesses to form UBM interconnects is repurposed. A portion(s) of the seed layer that is disposed in a recess to form a UBM interconnect is repurposed to extend outside the recess and coupled to another UBM interconnect where a raised interconnect bump is not formed. The UBM interconnect where a raised interconnect bump is not formed is deemed an "invisible" or "unraised" interconnect bump because of its lack of a formed raised interconnect bump. A UBM interconnect, even if it does not have a coupled interconnect bump, still has an interconnect path to the BEOL interconnect structure. Thus, a UBM interconnect without an interconnect bump that forms an unraised interconnect bump still provides an additional signaling path to the BEOL interconnect structure. This allows such unraised interconnect bumps to be provided in the IC package and coupled to raised interconnect bumps through the repurposed seed layer to provide an additional signal path(s) in a raised interconnect bump(s). This may also allow additional signal routing paths to be provided for raised interconnect bumps without having to consume additional raised interconnect bumps and without having to try to further reduce raised interconnect bump pitch in the BEOL interconnect structure.

In one exemplary aspect, an IC package is disclosed. The IC package includes a die. The die includes a BEOL interconnect structure. The die also includes a plurality of UBM interconnects each coupled to the BEOL interconnect structure. The plurality of UBM interconnects comprises a first UBM interconnect and a second UBM interconnect that does not have a coupled interconnect bump. The die further also comprises a seed layer coupling the first UBM interconnect to the second UBM interconnect, to couple the raised interconnect bump to the second UBM interconnect.

In another exemplary aspect, a method of fabricating a semiconductor wafer is disclosed. The method comprises forming a BEOL interconnect structure on a semiconductor layer. The method also comprises forming a plurality of UBM interconnects each coupled to the BEOL interconnect structure. Forming the plurality of UBM interconnects comprises forming a first UBM interconnect coupled to the BEOL interconnect structure. Forming the plurality of UBM interconnects also comprises forming a second UBM interconnect coupled to the BEOL interconnect structure, wherein the second UBM interconnect does not have a coupled interconnect bump. The method also comprises forming a seed layer coupling to the first UBM interconnect to the second UBM interconnect. The method also comprises forming a raised interconnect bump coupled to the first UBM interconnect coupling the raised interconnect bump to the second UBM interconnect.

BRIEF DESCRIPTION OF THE FIGURES

FIGS. 10A-10C is a flowchart illustrating another exemplary process of fabricating a die for an IC package, wherein the die includes a repurposed seed layer forming an unraised interconnect bump coupled to a raised interconnect bump, including, but not limited to, the dies in FIGS. 3A-8B;

FIGS. 11A-11I illustrate exemplary fabrication stages in the process in FIGS. 10A-10C;

DETAILED DESCRIPTION

Figure 1:
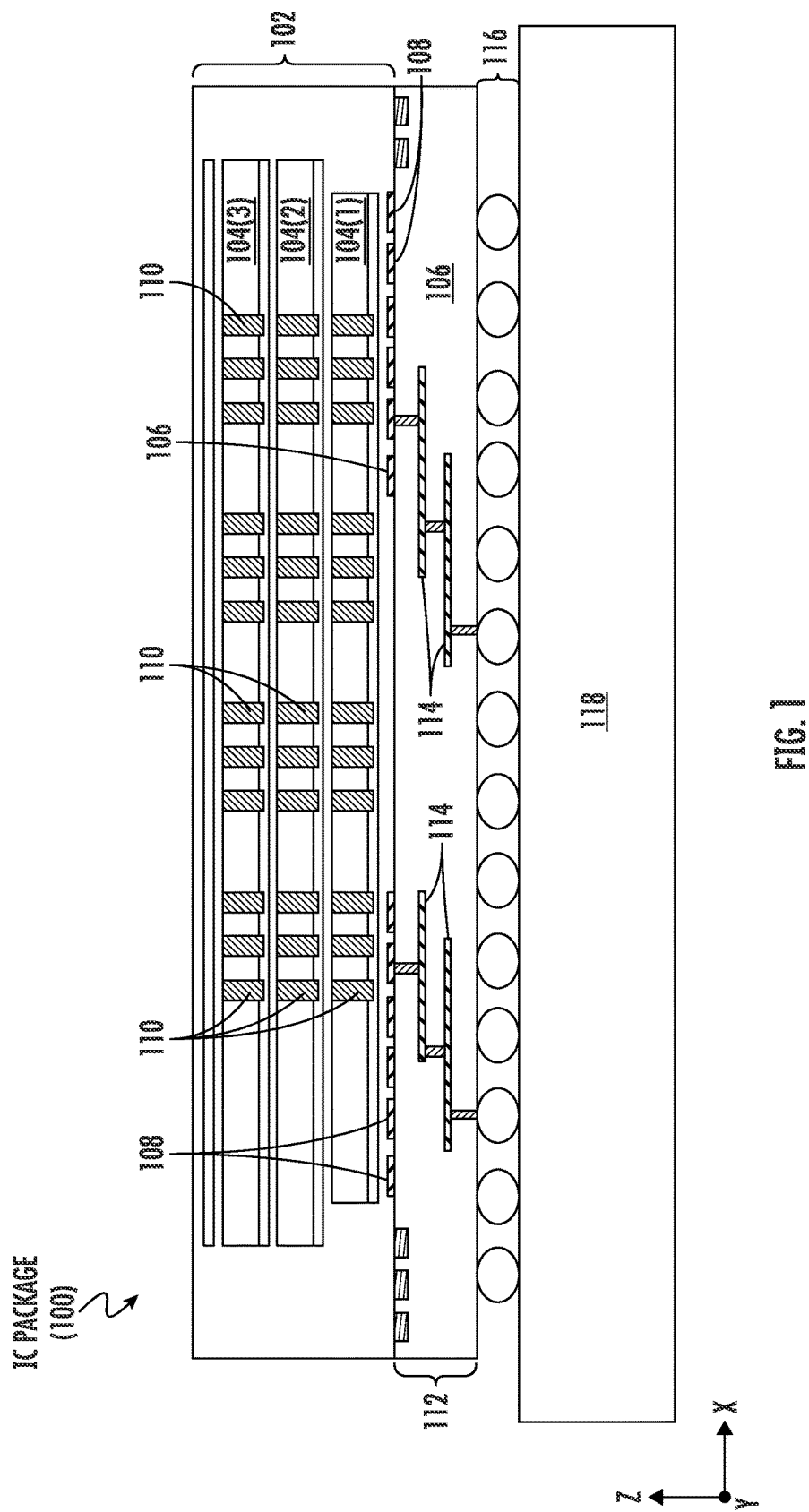
FIG. 1 is a cross-sectional side view of an exemplary integrated circuit (IC) package that includes a semiconductor die ("die") module with stacked dies coupled to a package substrate through interconnect bumps formed on the die.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include a semiconductor die ("die") employing a repurposed seed layer for forming additional signal paths to a back end-of-line (BEOL) structure of the die. Related integrated circuit (IC) packages and fabrication methods are also disclosed. The die includes a BEOL interconnect structure that includes one or more metallization layers. Each metallization layer includes metal interconnects to provide signal routing paths to devices formed in an active semiconductor layer of the die. The die also includes a plurality of under bump metallization (UBM) interconnects, also known as just UBM. The UBM interconnects are coupled to metal interconnects in an upper metallization layer of the BEOL interconnect structure to facilitate the formation of raised interconnect bumps (e.g., solder bumps, metal pillars). The raised interconnect bumps provide an electrical interconnect interface between the die and a package substrate of the IC package for signal routing. The UBM interconnects are formed by a metal seed layer (also known as a "bump distribution layer" (BDL)) disposed in recesses formed in a passivation layer disposed on the BEM interconnect structure that exposes the metal interconnects in the upper metallization layer of the BEOL interconnect structure. The raised interconnect bumps are formed in contact with UBM interconnects. It may be desired to decrease the raised interconnect bump pitch for an increased die connection density. The raised interconnect bump pitch affects the routing distance of signals between the die and the package substate, which can increase routing resistance and inductance. This can, for example, increase current-resistance (IR) drop for power signals routed through the raised interconnect bumps. Multiple raised interconnect bumps can be consumed and coupled together as a node to reduce resistance of a particular die interconnection, but this consumes additional interconnect bumps that could otherwise be used for other signal routing. Even consumption of multiple raised interconnect bumps may not provide the desired resistance reduction.

Fabrication methods allow the recesses in the BEOL interconnect structure, where the UBM interconnects are formed, to be of a smaller pitch than the minimum pitch of the raised interconnect bumps. The formation of these recesses is not subject to the same fabrication limitations as the formation of the raised interconnect bumps relating to minimum pitch. Thus, in exemplary aspects, to provide for additional signal paths to the die than would otherwise be limited by the minimum raised interconnect bump pitch of its IC package, the seed layer that is disposed in recesses to form UBM interconnects is repurposed. A portion(s) of the seed layer that is disposed in a recess to form a UBM interconnect is repurposed to extend outside the recess and coupled to another UBM interconnect where a raised interconnect bump is not formed. The UBM interconnect where a raised interconnect bump is not formed is deemed an "invisible" or "unraised" interconnect bump because of its lack of a formed raised interconnect bump. A UBM interconnect, even if it does not have a coupled interconnect bump, still has an interconnect path to the BEOL interconnect structure. Thus, a UBM interconnect without an interconnect bump that forms an unraised interconnect bump still provides an additional signaling path to the BEOL interconnect structure. This allows such unraised interconnect bumps to be provided in the IC package and coupled to raised interconnect bumps through the repurposed seed layer to provide an additional signal path(s) for a raised interconnect bump(s). This may also allow additional signal routing paths to be provided for raised interconnect bumps without having to consume additional raised interconnect bumps and without having to try to further reduce raised interconnect bump pitch in the BEOL interconnect structure.

Figure 2:
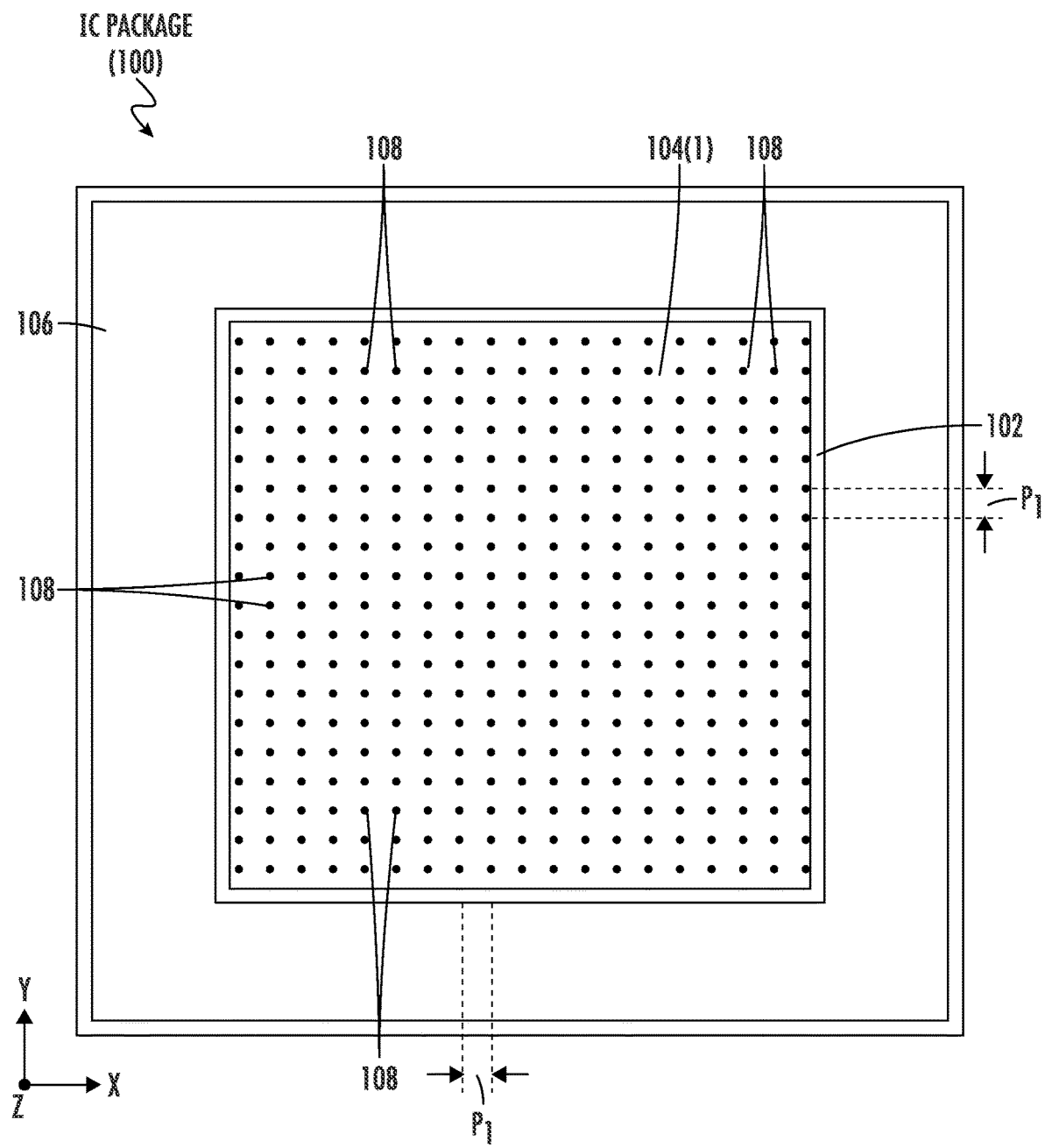
FIG. 2 is a top view of a bottom die in the die module in the IC package in FIG. 1.
Figure 3A:
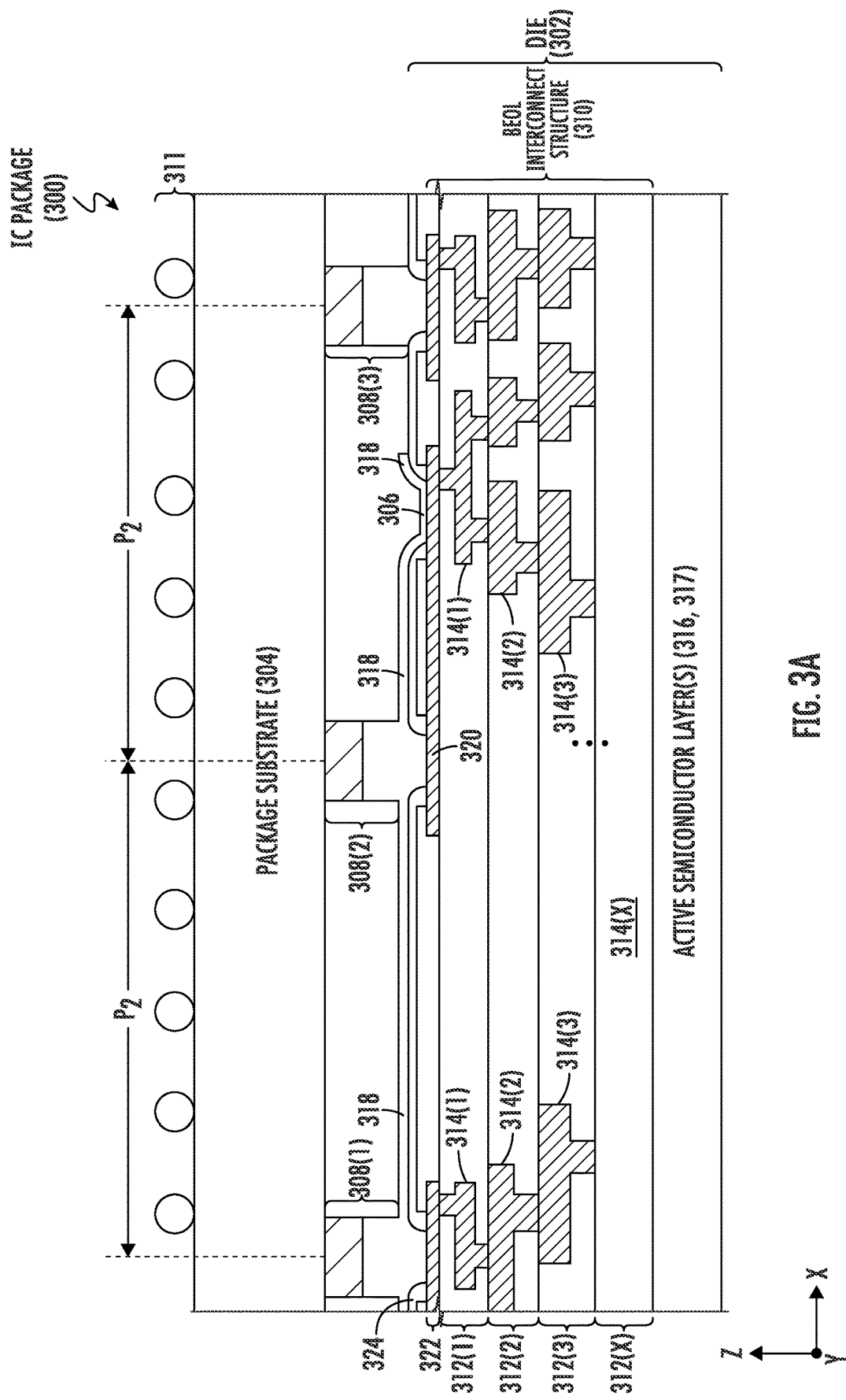
FIGS. 3A and 3B are cross-sectional side views of an exemplary IC package that includes a die that includes a repurposed seed layer coupling raised interconnect bumps to an unraised interconnect bump to provide an additional signal path between the raised interconnect bumps and a back end-of-line (BEOL) interconnect structure of the die.
Figure 3B:
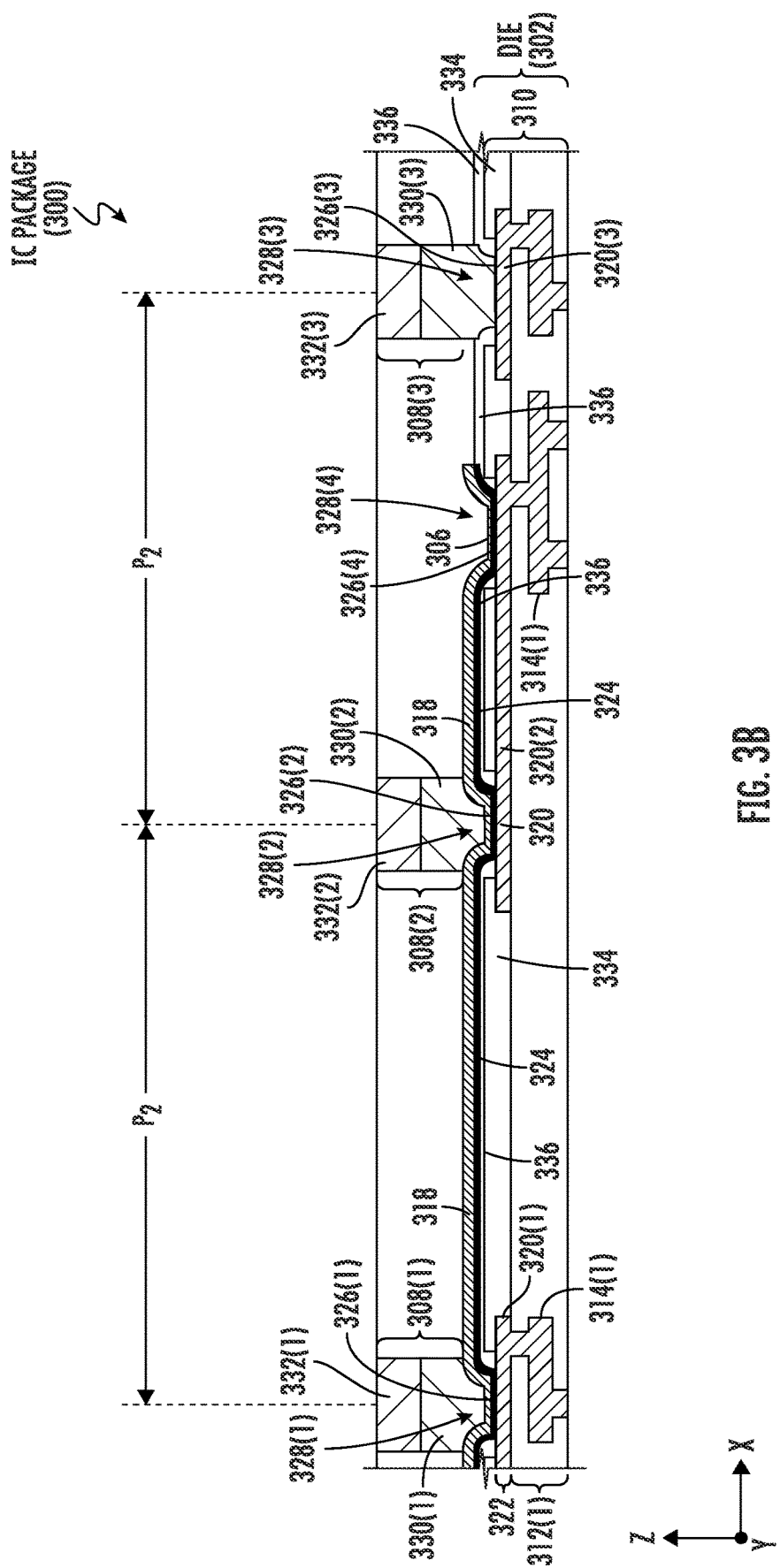

Before discussing exemplary dies employing a repurposed seed layer for forming additional signal paths to a BEOL interconnect structure of a die starting at FIGS. 3A and 3B, an exemplary integrated circuit IC package 100 that includes dies 104(1)-104(3) coupled to a package substrate 106 through interconnect bumps is first described with regard to FIGS. 1 and 2.

In this regard, FIG. 1 illustrates an IC package 100 that includes a die module 102 that includes a plurality of dies 104(1)-104(3) in a stacked configuration in a vertical direction (Z-axis direction) coupled to a package substrate 106. Three dies 104(1)-104(3) are shown, but note that the IC package 100 is not limited to any particular number of dies. The die module 102 includes raised interconnect bumps 108 that are coupled to the die 104(1) to facilitate coupling between the die 104(1) and the package substrate 106. The raised interconnect bumps 108 are formed on the die module 102 at a desired interconnect bump pitch according to the signaling density need for the application of the IC package 100 and fabrication process limitations. The raised interconnect bumps 108 are die interconnects that are formed from a metal material, such as copper. A solder joint may also be formed on the metal material of the raised interconnect bump 108 to facilitate providing a soldered coupling to the package substrate 106. The dies 104(1)-104(3) in this example include vertical interconnect accesses (vias) 110, such as through-silica vias (TSVs), to provide coupling between the stacked dies 104(1)-104(3) and to raised interconnect bumps 108 so that dies 104(2), 104(3) can be coupled to the package substrate 106 through intervening dies 104(1), 104(2), respectively. The package substrate 106 includes metallization layers 112 that each include metal interconnects 114. Metal interconnects 114 can be coupled to the raised interconnect bumps 108 to provide signal routing paths between the dies 104(1)-104(3) and the package substrate 106. Metal interconnects 114 can also be coupled to external interconnect bumps 116 (e.g., solder bumps, ball grid arrays (BGAs), land grid arrays (LGAs)) that are external to the IC package 100 to facilitate coupling of the IC package 100 to a circuit board 118. In this manner, the package substrate 106 and the raised interconnect bumps 108 provide signal routing paths between the dies 104(1)-104(3) and the external interconnect bumps 116 to the circuit board 118. Also, some of the metal interconnects 114 may be coupled to each other to reduce resistance of such connections and/or to provide die-to-die (D2D) interconnections. Also, some of the raised interconnect bumps 108 may be coupled to the same metal interconnects 114 to further lower resistance. For example, this may be desired for power signal routing paths to reduce current-resistance (IR) drop.

FIG. 2 illustrates a top view of the IC package 100 in FIG. 1 illustrating the die 104(1) disposed on the package substrate 106. The raised interconnect bumps 108 coupling the die 104(1) to the package substrate 106 have an interconnect bump pitch $P_1$. It may be desired to decrease the interconnect bump pitch $P_1$ of the raised interconnect bumps 108 of the die module 102 for an increased die connection density in the IC package 100. The pitch $P_1$ of the raised interconnect bumps 108 affects the routing distance of signal paths between the dies 104(1)-104(3) and the package substate 106. An increased routing distance in a signal routing path can increase resistance for carried signals on the signal path. If these carried signals are power signals, an increase in resistance in signal routing paths can also increase IR drop, thereby impacting performance of the dies 104(1)-104(3). Multiple interconnect bumps 108 can be consumed and electrically coupled together in the die module 102 to reduce resistance of a particular die interconnection, but this consumes additional raised interconnect bumps 108 that could otherwise be used for other signal routing.

In this regard, to be able to provide more interconnect bump-like structures to provide additional signal routing paths for raised interconnect bumps that couple the die to the package substrate, and without necessarily having to decrease the raised interconnect bump pitch, a seed layer (e.g., a bump distribution layer) can form additional UBM interconnects that do not have interconnect bump (e.g., raised interconnect bump) formed thereon. A UBM interconnect that does not have a coupled interconnect bump, that for example is formed thereon, is deemed an "unraised" interconnect bump. The seed layer that is deposited adjacent to an outer metallization layer of the BEOL interconnect structure of the die can be repurposed to form additional unraised interconnect bumps. In this regard, the seed layer is selectively removed during fabrication to leave at least a portion of the seed layer that couples a raised metal interconnect formed in a UBM interconnect and electrically coupled to the BEOL interconnect structure, to one or more other UBM interconnects where an interconnect bump (e.g., raised interconnect bump) is not formed. This other UBM interconnect where an interconnect bump is not formed is deemed to be an "invisible" or "unraised" interconnect bump, because although a UBM interconnect bump is not formed in such UBM interconnect, the seed layer in such UBM interconnect is also electrically coupled to the BEOL interconnect structure. Additional signal routing paths can be provided between raised interconnect bumps to the BEOL interconnect structure by the presence of the seed layer coupling a raised interconnect bump to an unraised interconnect bump. This may also allow additional signal routing paths to be provided for raised interconnect bumps by their coupling through a repurposed seed layer to an unraised interconnect bump(s) without having to consume additional raised interconnect bumps and without having to try to further reduce interconnect bump pitch. This is shown by example in FIGS. 3A and 3B discussed below.

In this regard, FIG. 3A is a cross-sectional side view of an exemplary IC package 300 that includes a die 302 coupled to a package substrate 304, and an unraised interconnect bump 306 for providing an additional signal path between the die 302 and the package substrate 304. The package substrate 304 is shown above the die 302 in the vertical, Z-axis direction in FIG. 3A, with the die 302 flipped. In this example, the unraised interconnect bump 306 is disposed between raised interconnect bumps 308(2), 308(3). By "unraised" interconnect bump, it is meant that a UBM interconnect (discussed in more detail in FIG. 3B) formed in a BEOL interconnect structure 310 does not have a coupled interconnect bump (e.g., a raised interconnect bump formed on the UBM interconnect) like raised interconnect bumps 308(1)-308(3). The raised interconnect bumps 308(1)-308 (3) couple a BEOL interconnect structure 310 of the die 302 to the package substrate 304 to provide signal routing paths between the die 302 and the package substrate 304, including to external interconnect bumps 311 (e.g., solder bumps, ball grid arrays (BGAs), land grid arrays (LGAs)). The BEOL interconnect structure 310 is an interconnect structure that includes an outer BEOL metallization layer 312(1) and also a plurality of BEOL metallization layers 312(2)-312(X) in this example. FIG. 3A shows the BEOL metallization layers 312(1)-312(3) including respective metal interconnects 314(1)-314(X) that provide signal routing paths between an active semiconductor layer(s) 316 in the die 302 and the BEOL interconnect structure 310. The active semiconductor layer(s) 316 is a front end-of-line (FEOL) structure 317 that includes semiconductor devices, such as transistors.

As discussed in more detail below, the unraised interconnect bump 306 does not include a raised metal pillar or structure like raised interconnect bumps 308(1)-308(3). Thus, the formation of the unraised interconnect bump 306 may not be subject to the same pitch fabrication process limitations as formation of the raised interconnect bumps 308(1)-308(3). The raised interconnect bumps 308(1)-308 (3) in FIG. 3A have an interconnect bump pitch $P_2$ that limits the number and density of interconnect bumps formed to couple the die 302 to the package substrate 304 in the IC package 300. In this example, the unraised interconnect bump 306 is able to be formed a shorter distance away from adjacent raised interconnect bumps 308(2), 308(3) than the interconnect bump pitch $P_2$.

As will be discussed in more detail below, the unraised interconnect bump 306 is coupled through a repurposed seed layer 318 (also known as a bump distribution layer (BDL)) to the raised interconnect bumps 308(1)-308(2) in this example. The raised interconnect bump 308(2) is coupled through the repurposed seed layer 318 to an adjacent raised interconnect bump 308(1) to couple both interconnect bumps 308(1)-308(2), together with the unraised interconnect bump 306, through the repurposed seed layer 318, In this example, the unraised interconnect bump 306 is also coupled to a metal interconnect in the form of a redistribution layer (RDL) interconnect 320 (e.g., a metal pad, such as an Aluminum metal pad) in an RDL 322 of the die 302 that is formed on the BEOL metallization layer 312(1) of the BEOL interconnect structure 310. In this manner, the unraised interconnect bump 306 provides a signal routing path to the BEOL interconnect structure 310. The RDL 322 is a type of metallization layer that can be provided in the BEOL interconnect structure 310. The RDL 322 includes metal interconnects in the form of the RDL interconnects 320. The RDL interconnects 320 are metal interconnects formed from a metal material. Because the unraised interconnect bump 306 is coupled to the raised interconnect bumps 308(1), 308(2) through the repurposed seed layer 318, the unraised interconnect bump 306 provides an additional signal routing path for signals that are carried over the coupled raised interconnect bumps 308(1), 308(2). In this manner, an additional signal routing path can be provided for raised interconnect bumps 308(1), 308(2) to the BEOL interconnect structure 310 through their coupling to the unraised interconnect bump 306.

FIG. 3B is a cross-sectional view of the die 302 in FIG. 3A to facilitate further discussion and additional exemplary details of the upraised interconnect bump 306 coupled to raised interconnect bumps 308(1), 308(2). As shown in FIG. 3B, in this example, the die 302 includes a UBM layer 324 that is disposed on passivation layers 334, 336 and in contact with RDL interconnects 320 of the RDL 322. Only the UBM layer 324 for UBM interconnects 326(1), 326(2) and the second UBM interconnect 326(4) is shown in the cross-sectional side view of the IC package 300 in FIG. 3B. The UBM layer formed underneath raised interconnect bump 308(3) is hidden in the cross-sectional view in FIG. 3. The UBM layer 324 is a thin metal layer disposed on (e.g., sputtered on) the passivation layers 334, 336 in this example, which is disposed on the BEOL interconnect structure 310. The passivation layers 334, 336 are dielectric materials (e.g., Polyimide, Silicon Nitride, Silicon Oxide) that are disposed on the RDL 322 in this example and are formed on the outer BEOL metallization layer 312(1). The passivation layer 334 protects the RDL interconnects 320 in the RDL 322 from oxidation and/or corrosion, The second passivation layer 336 may also be disposed on the first passivation layer 334. The passivation layer 334 (and optional passivation layer 336) is selectively removed (e.g., etched) during fabrication to form recesses 328(1)-328(4). The recesses 328(1)-328(4) extend down to and expose the RDL interconnects 320(1)-320(4) of the RDL 322. This provides an interconnect path for the UBM layer 324 to be formed inside the respective recesses 328(1)-328(2), 328(4) to form UBM interconnects 326(1)-326(2), and the second UBM interconnect 326(4) coupled to the RDL, interconnects 320(1)-320(2), 320(4) to provide a signaling path to the BEOL interconnect structure 310. The UBM interconnect 326(3) (not shown in FIG. 3B) is formed in the recess 328(3) and coupled to a RDL interconnect 320(3) to provide a signaling path to the BEOL interconnect structure 310. The UBM interconnects 326(1)-326(3) facilitate the formation of the raised interconnect bumps 308(1)-308(3). As will be discussed below, a raised interconnect bump is not formed on the second UBM interconnect 326(4) such that the second UBM interconnect 326(4) forms the unraised interconnect bump 306. In this example, the recesses 328(1)-328 (3) can be formed of a shorter distance in the horizontal direction (X- or Y-axis directions) from each other than the raised interconnect bump pitch $P_2$.

With continuing reference to FIG. 3B, the seed layer 318 is disposed over the UBM layer 324 and in the recesses 328(1)-328(2), 328(4) which is in contact with respective RDL interconnects 320(1)-320(2), 320(4) in the recesses 328(1)-328(2), 328(4). The portion of the seed layer 318 that is disposed and is resident inside the recesses 328(1)-328(2), 328(4) is in contact with the UBM layer 324 coupled to the RDL interconnects 320(1)-320(2), 320(4). The UBM layer 324 also forms part of the UBM interconnects 326(1)-326 (2), 324(4) which are sometimes referred to as just UBMs. The UBM interconnects 326(1)-326(3) and the second UBM interconnect 326(4) are in contact with and electrically coupled to a respective RDL interconnect 320(1)-320(3) formed in the RDL 322 to provide an electrical connection between the UBM interconnects 326(1)-326(3) and the second UBM interconnect 326(4), and the BEOL interconnect structure 310. The recesses 328(1)-328(3) were formed to prepare for the raised interconnect bumps 308(1)-308(3) to be formed in contact with the respective UBM interconnects 326(1)-326(3), and thus the BEOL interconnect structure 310. In this manner, the UBM interconnects 326(1)-326(3) are each coupled to a metal interconnect 314(1) in the outer BEOL metallization. layer 312(1) through the RDL interconnects 320(1)-320(3) in the RDL 322 in this example. The raised interconnect bumps 308(1)-308(3) are formed in contact with the UBM interconnects 326(1)-326(3) to provide a signal routing path between the raised interconnect bumps 308(1)-308(3) (and the coupled package substrate 304 as shown in FIG. 3A) and the BEOL interconnect structure 310.

In this example, the raised interconnect bumps 308(1)-308(3) include respective metal pillars 330(1)-330(3) (e.g., metal posts). The metal pillars 330(1)-330(3) are formed of a metal material (e.g., copper) that is disposed in the respective recesses 328(1)-328(3) in contact with the respective UBM interconnects 326(1)-326(3), Solder joints 332 (1)-332(3) may be coupled to the metal pillars 330(1)-330(3) to provide for coupling the die 302 to the package substrate 304 (FIG. 3A) in a solder reflow process.

The UBM interconnects 326(1)-326(3) that facilitate the formation of the respective raised interconnect bumps 308 (1)-308(3) have a UBM interconnect bump pitch that is interconnect bump pitch $P_2$, that may be a minimum pitch due to process limitations of the BEOL interconnect structure 310. The pitches of the raised interconnect bumps 308(1)-308(3) do not have to be the same pitch. These signal routing paths can then be coupled to the semiconductor devices formed in the active semiconductor layer 316 (FIG. 3A) to provide signal routing paths between the raised interconnect bumps 308(1)-308(3) and the active semiconductor layer 316.

With continuing reference to FIG. 3B, the seed layer 318 is left resident (i.e., repurposed) to couple the raised interconnect bumps 308(1), 308(2) to the second UBM interconnect 326(4) that forms the unraised interconnect bump 306 in recess 328(4). The second UBM interconnect 326(4) forms the unraised interconnect bump 306 in this example, because an interconnect bump (e.g., a raised interconnect bump) is not formed on the second UBM interconnect 326(4). The portion of the seed layer 318 that extends into the recess 328(4) forms the second UBM interconnect 326(4) that forms the unraised interconnect bump 306. As discussed above, the second UBM interconnect 326(4) that forms the unraised interconnect bump 306, is coupled to a metal interconnect 314(1) in the outer BEOL metallization layer 312(1), through the RDL 322, to provide an additional signal routing path to the raised interconnect bump 308(2). This is because the seed layer 318 is left resident (i.e., repurposed) in fabrication to extend continuously outside the recesses 328(1), 328(2), 328(4) in contact with the UBM interconnects 326(1)-326(2), and the second UBM interconnect 326(4) and the raised interconnect bumps 308(1), 308(2) and unraised interconnect bump 306. The UBM layer 324 and the seed layer 318 are only selectively removed during fabrication of the die 302 such that the raised interconnect bumps 308(1), 308(2) are coupled to the unraised interconnect bump 306. Note that an additional passivation layer(s) could also be disposed on the seed layer 318 that is exposed outside of the raised interconnect bumps 308(1)-308(3) to protect the seed layer 318.

With continuing reference to FIG. 3B, as an example, the unraised interconnect bump 306 could be employed to provide an additional signal path for the raised interconnect bumps 308(1), 308(2) that are part of a power distribution network (PDN) of the IC package 300 to reduce resistance and IR drop. The unraised interconnect bump 306 could be employed to provide a signaling path for an input/output (I/O) signal node of the die 302 that provides an I/O signal from I/O circuitry in the die 302. The unraised interconnect bump 306 and coupled raised interconnect bumps 308(1), 308(2) could be coupled to a ground plane formed by coupled metal interconnects 314(1)-314(X) in the BEOL metallization layers 312(1)-312(X) (see also FIG. 3A) in the IC package 300. In this example, the seed layer 318 would be coupled to the ground plane as part of the PDN to provide an additional signaling path between the package substrate 304 and ground. Alternatively, the unraised interconnect bump 306 could provide an additional signal path for the raised interconnect bumps 308(1), 308(2) that are part of a positive power rail of the PDN of the IC package 300. Still further, the unraised interconnect bump 306 could be provided to provide an additional or alternate signal path for the raised interconnect bumps 308(1), 308(2) that are part of a signaling path (e.g., an I/O signaling path) between the package substrate 304 and the die 302 that is not part of a PDN for distributing power in the IC package 300.

Figure 4:
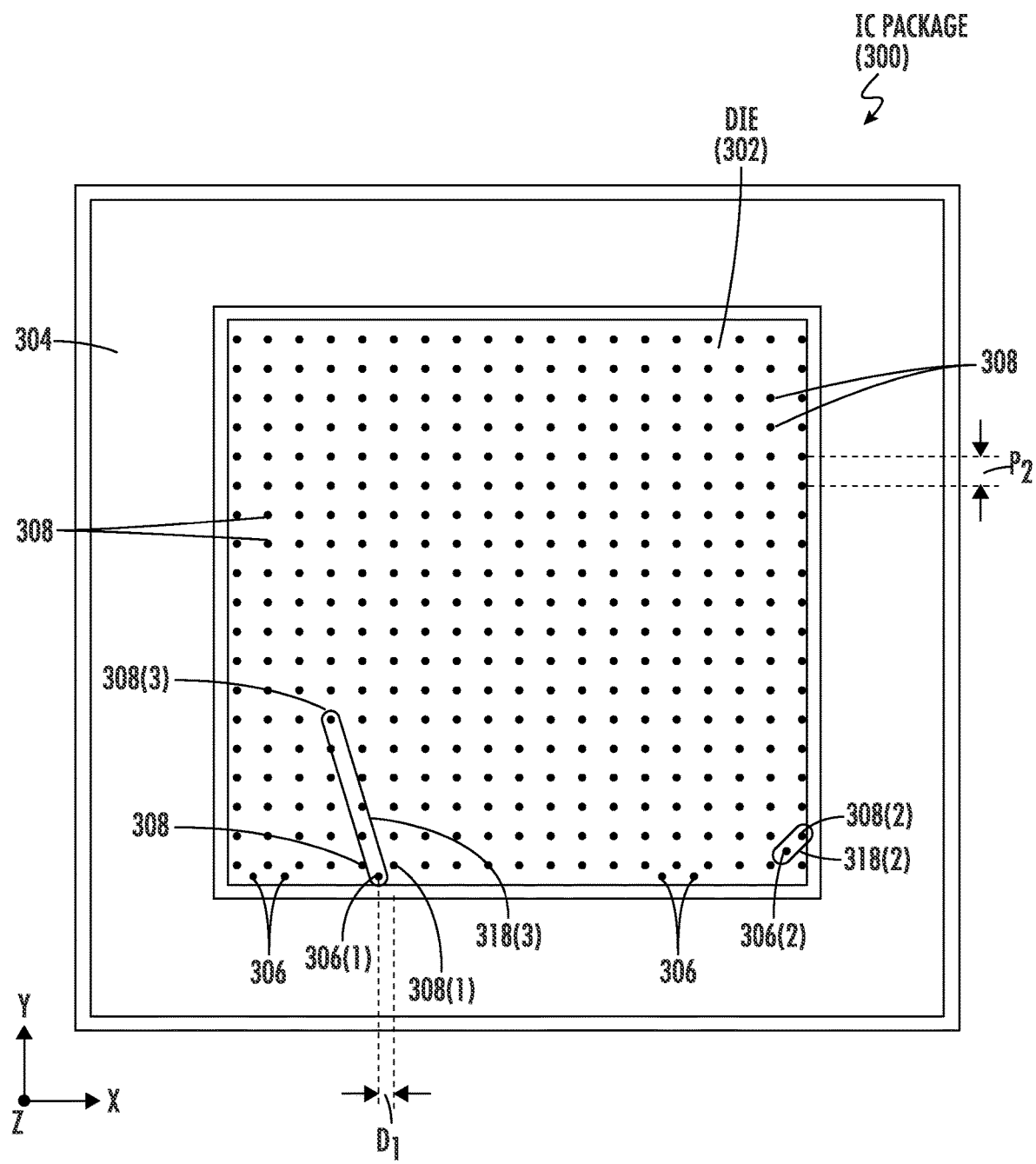
FIG. 4 is a top view of an exemplary IC package that includes raised interconnect bumps coupling the die in FIGS. 3A and 3B to a package substrate, wherein the die includes a repurposed seed layer coupling a raised interconnect bump(s) to an unraised interconnect bump(s) to provide an additional signal path between the raised interconnect bump(s) and a BEOL interconnect structure of the die.

FIG. 4 illustrates a top view of the IC package 300 in FIGS. 3A and 3B illustrating a die 302 disposed on the package substrate 304. The raised interconnect bumps 308 coupling the die 302 to the package substrate 304 have the interconnect bump pitch $P_2$. Unraised interconnect bumps 306 are formed on the die 302 in between and adjacent to raised interconnect bumps 308 to provide additional signal routing paths to the package substrate 304. Note that for example, the distance $D_1$ between unraised interconnect bump 306(1) and the raised interconnect bump 308(1) is less than the interconnect bump pitch $P_2$. In this manner, additional unraised interconnect bumps 306 can be provided between and adjacent to raised interconnect bumps 308 and coupled to one or more interconnect bumps 308 to provide additional signal routing paths between the die 302 and the package substrate 304 and/or to reduce resistance of certain signal routing paths. As an example, raised interconnect bump 308(2) is coupled to unraised interconnect bump 306(2) through a repurposed seed layer 318(2). It may also be desired to provide for certain unraised interconnect bumps 306 to be coupled to raised interconnect bumps 308 that are not directly adjacent to each other. For example, it may be desired to route signals from a raised interconnect bump 308 that is not directly adjacent to an unraised interconnect bump 306 and located a distance more than interconnect bump pitch $P_2$ from the desired raised interconnect bump 308 to be coupled. This is shown by example in FIG. 4, where unraised interconnect bump 306(1) is coupled to raised interconnect bump 308(3) through a repurposed seed layer 318(3).

Figure 5:
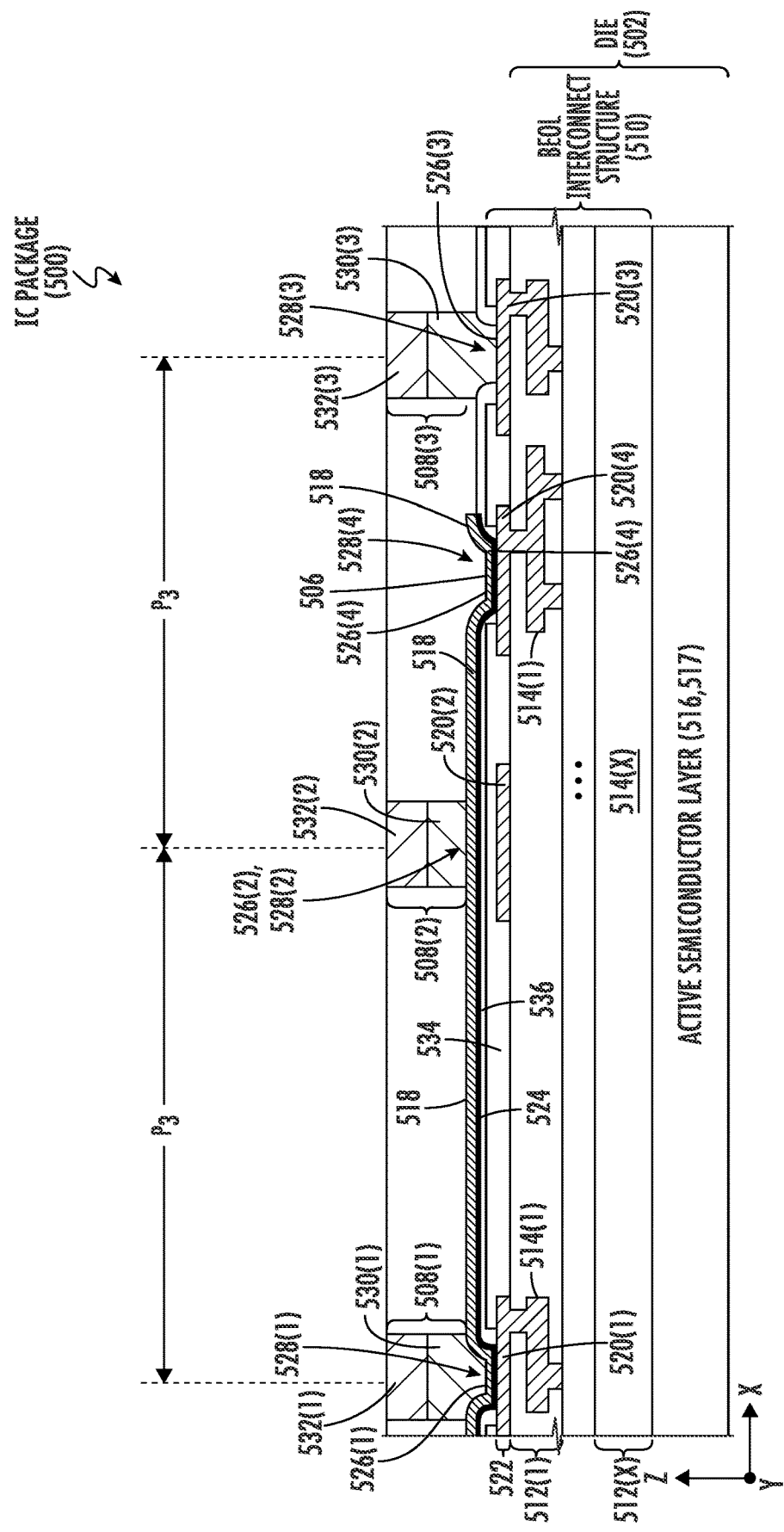
FIG. 5 is a cross-sectional side view of another exemplary IC package that includes a die that includes a repurposed seed layer coupling a raised interconnect bump to an unraised interconnect bump located a distance away from the interconnect bump greater than the interconnect bump pitch, to provide an additional signal path between the raised interconnect bump and a BEOL interconnect structure of the die.

FIG. 5 is a cross-sectional side view of another IC package 500 that includes a die 502 that includes a repurposed seed layer 518 coupling a raised interconnect bump 508(1) to an unraised interconnect bump 506 that are not immediately adjacent to each other. The unraised interconnect bump 506 is coupled to the raised interconnect bump 508(1) that is located a distance away from the raised interconnect bump 508(1) greater than the interconnect bump pitch $P_3$ of the raised interconnect bumps 508(1)-508(3). In this example, the unraised interconnect bump 506 is disposed between raised interconnect bumps 508(2), 508(3). The raised interconnect bumps 508(1)-508(3) couple a BEOL interconnect structure 510 of the die 502 to a package substrate (not shown) to provide signal routing paths between the die 502 and the package substrate. The BEOL interconnect structure 510 is an interconnect structure that includes an outer BEOL metallization layer 512(1) and also a plurality of BEOL metallization layers 512(2)-512(X) in this example. The BEOL metallization layers 512(1)-512(X) include respective metal interconnects 514(1)-514(X) that provide signal routing paths between an active semiconductor layer(s) 516 in the die 502 and the BEOL interconnect structure 510. The active semiconductor layer(s) 516 is a front end-of-line (FEOL) structure 517 that includes semiconductor devices, such as transistors.

Like the unraised interconnect bump 306 in the die 302 in FIGS. 3A and 3B, the unraised interconnect bump 506 in the die 502 in FIG. 5 does not include a raised interconnect bump like provided as raised interconnect bumps 508(1)-508(3). Thus, the formation of the unraised interconnect bump 506 may not be subject to the same pitch fabrication process limitations as formation of the raised interconnect bumps 508(1)-508(3). The raised interconnect bumps 508(1)-508(3) in FIG. 5 have an interconnect bump pitch $P_3$ that limits the number and density of interconnect bumps coupled to the die 502 in the IC package 500. In this example, the unraised interconnect bump 506 is able to be formed a shorter distance away from adjacent raised interconnect bumps 508(2), 508(3) than the interconnect bump pitch $P_3$. The unraised interconnect bump 506 is coupled through the repurposed seed layer 518 to the raised interconnect bump 508(1) in this example located a greater distance away from the unraised interconnect bump 506 than the interconnect bump pitch $P_3$. In this example, the unraised interconnect bump 506 is also coupled to a RDL interconnect 520(4) (e.g., a metal pad, such as an Aluminum metal pad) in a RDL 522 of the die 502 that is formed on the outer BEOL metallization layer 512(1) of the BEOL interconnect structure 510. The RDL 522 can be another metallization layer that can be included in the BEOL interconnect structure 510. The RDL interconnects 520(1)-520(4) are metal interconnects formed from a metal material. The unraised interconnect bump 506 provides a signal routing path to the BEOL interconnect structure 510. And because the unraised interconnect bump 506 is coupled to the raised interconnect bump 508(1) through the repurposed seed layer 518, the unraised interconnect bump 506 provides an additional or alternate signal routing path for signals that are carried over the coupled raised interconnect bump 508(1). In this manner, an additional or alternate signal routing path can be provided for raised interconnect bump 508(1) to the BEOL interconnect structure 510 through the coupling to the unraised interconnect bump 506, without having to consume additional raised interconnect bumps and without having to try to further reduce the interconnect bump pitch $P_3$.

With continuing reference to FIG. 5, in this example, the die 502 includes a UBM layer 524. The UBM layer 524 extends between recesses 528(1) and 528(4), but appears to run underneath raised interconnect bump 508(2) because FIG. 5 is a cross-sectional view where raised interconnect bump 508(2) is located behind recesses 528(1), 528(4). The UBM layer 524 is disposed on the passivation layers 534, 536 and in the recesses 528(1), 524(4) on the RDL 522 in contact with respective RDL interconnects 520(1), 520(4). The UBM layer 524 is a thin metal layer disposed partially on the passivation layers 534, 536 disposed on the BEOL interconnect structure 510. The passivation layers 534, 536 are both a dielectric material (e.g., Polyimide, Silicon Nitride, Silicon Oxide) that is disposed on the RDL 522 in this example and is formed on the outer BEOL metallization layer 512(1). The passivation layer 534 protects the RDL interconnects 520 of the RDL 522 from oxidation and/or corrosion. The second passivation layer 536 may also be disposed on the first passivation layer 534. The passivation layer 534 (and optional passivation layer 536) are selectively removed (e.g., etched) during fabrication to form recesses 528(1)-528(4). Recess 528(2) is not directly shown in the cross-sectional view of FIG. 5, because the cross-section location in FIG. 5 is in front of the raised interconnect bump 508(2) out of the figure in the Y-axis direction.

With continuing reference to FIG. 5, the recesses 528(1)-528(4) extend down to the RDL interconnects 520(1)-520(4) to expose the RDL interconnects 520(1)-520(4) of the RDL 522. This provides an interconnect path for the UBM layer 524 inside the respective recesses 528(1), 528(4) to form UBM interconnect 526(1) and second UBM interconnect 526(4), each coupled to respective RDL interconnects 520(1), 520(4), to provide a signaling path to the BEOL interconnect structure 510. UBM interconnects 526(2), 526(3) are formed from a UBM layer and seed layer that are not shown in the cross-sectional view of the package 500 in FIG. 5. The UBM interconnects 526(1)-526(3) facilitate the formation of the raised interconnect bumps 508(1)-508(3). As will be discussed below, a raised interconnect bump is not formed on the second UBM interconnect 526(4) such that the second UBM interconnect 526(4) forms the unraised interconnect bump 506. In this example, the recesses 528(1)-528(4) can be formed of a shorter distance in the horizontal direction (X-axis or Y-axis direction) from each other than the raised interconnect bump pitch $P_3$.

With continuing reference to FIG. 5, the seed layer 518 is disposed over the UBM layer 524, which is in contact with respective RDL interconnects 520(1), 520(4) in the recesses 528(1), 528(4). The UBM layer 524 forms part of the UBM interconnect 526(1) and the second UBM interconnect 526(4), which are sometimes referred to as just UBMs. Thus, the UBM interconnect 526(1) and the second UBM interconnect 526(4) are in contact with and electrically coupled to a respective RDL interconnect 520(1), 520(4) formed in the RDL 522 to provide an electrical connection between the UBM interconnect 526(1) and the second UBM interconnect 526(4) and the BEOL interconnect structure 510. The UBM interconnects 526(2), 326(3) are also in contact with respective RDL interconnects 520(2), 520(3), but such is hidden in the cross-sectional view in FIG. 5. The recesses 528(1)-528(3) were formed to prepare for the raised interconnect bumps 508(1)-508(3) to be formed in contact with the respective UBM interconnects 526(1)-526(3), and thus the BEOL interconnect structure 510. In this manner, the UBM interconnects 526(1)-526(3) are each coupled to a metal interconnect 514(1) in the outer BEOL metallization layer 512(1) through the RDL interconnects 520(1)-520(3) in the RDL 522 in this example. The raised interconnect bumps 508(1)-508(3) are formed in contact with the UBM interconnects 526(1)-526(3) to provide a signal routing path between the raised interconnect bumps 508(1)-508(3) and the BEOL interconnect structure 510.

In this example, the raised interconnect bumps 508(1)-508(3) include respective metal pillars 530(1)-530(3) (e.g., metal posts). The metal pillars 530(1)-530(3) are formed of a metal material (e.g., copper) that is disposed in the respective recesses 528(1)-528(3) in contact with the respective UBM interconnects 526(1)-526(3). Solder joints 532(1)-532(3) may be coupled to the metal pillars 530(1)-530(3) to provide for coupling the die 502 to the package substrate 304 (FIG. 3A) in a solder reflow process.

The UBM interconnects 526(1)-526(3) that facilitate the formation of the respective raised interconnect bumps 508(1)-508(3) have a UBM interconnect bump pitch that is interconnect bump pitch $P_3$ that may be a minimum pitch due to process limitations of the BEOL interconnect structure 510. The pitches of the raised interconnect bumps 508(1)-508(3) do not have to be the same pitch. These signal routing paths can then be coupled to the semiconductor devices formed in the active semiconductor layer 516 to provide signal routing paths between the raised interconnect bumps 508(1)-508(3) and the active semiconductor layer 516.

With continuing reference to FIG. 5, the seed layer 518 is left resident (i.e., repurposed) to couple the raised interconnect bump 508(1) to the second UBM interconnect 526(4) that forms the unraised interconnect bump 506 in recess 528(4). The second UBM interconnect 526(4) forms the unraised interconnect bump 506 in this example, because an interconnect bump (e.g., a raised interconnect bump) is not formed on the second UBM interconnect 526(4). The portion of the seed layer 518 that extends into the recess 528(4) forms the second UBM interconnect 526(4) that forms the unraised interconnect bump 506. As discussed above, the second UBM interconnect 526(4) that forms the unraised interconnect bump 506 is coupled to a metal interconnect 514(1) in the outer BEOL metallization layer 512(1), through the RDL 522, to provide an additional signal routing path to the raised interconnect bump 508(1). This is because the seed layer 518 is left resident (i.e., repurposed) in fabrication to extend continuously over and into the recess 528(1) in contact with the UBM interconnect 526(1) and the raised interconnect bump 508(1) formed therein. The UBM layer 524 and the seed layer 518 are only selectively removed during fabrication of the die 502 such that the raised interconnect bump 508(1) is coupled to the unraised interconnect bump 506. Note that an additional passivation layer(s) could also be disposed on the seed layer 518 to protect the seed layer 518. This may be desired since the seed layer 518 is repurposed and left resident outside of the recesses 528(1)-528(4) to couple the raised interconnect bump 508(1) to the unraised interconnect bump 506.

For example, with continuing reference to FIG. 5, the unraised interconnect bump 506 could be provided to provide an additional signal path for the raised interconnect bump 508(1) that is part of a PDN of the IC package 500 to reduce resistance and IR drop. The unraised interconnect bump 506 could be employed to provide a signaling path for an I/O signal node of the die 502 that provides an I/O signal from I/O circuitry in the die 502. The unraised interconnect bump 506 and coupled raised interconnect bump 508(1) could he coupled to a ground plane formed by coupled metal interconnects 514(1)-514(X) in the BEOL metallization layers 512(1)-512(X) in the IC package 500. In this example, the seed layer 518 would be coupled to the ground plane as part of the PDN to provide an additional signaling path between a package substrate and ground. Alternatively, the unraised interconnect bump 506 could provide an additional signal path for the raised interconnect bump 508(1) that is part of a positive power rail of the PDN of the IC package 500. Still further, the unraised interconnect bump 506 could be provided to provide an additional or alternate signal path for the raised interconnect bump 508(1) that is part of a signaling path (e.g., an I/O signaling path) to the die 502 that is not part of a PDN for distributing power in the IC package 500.

Figure 6:
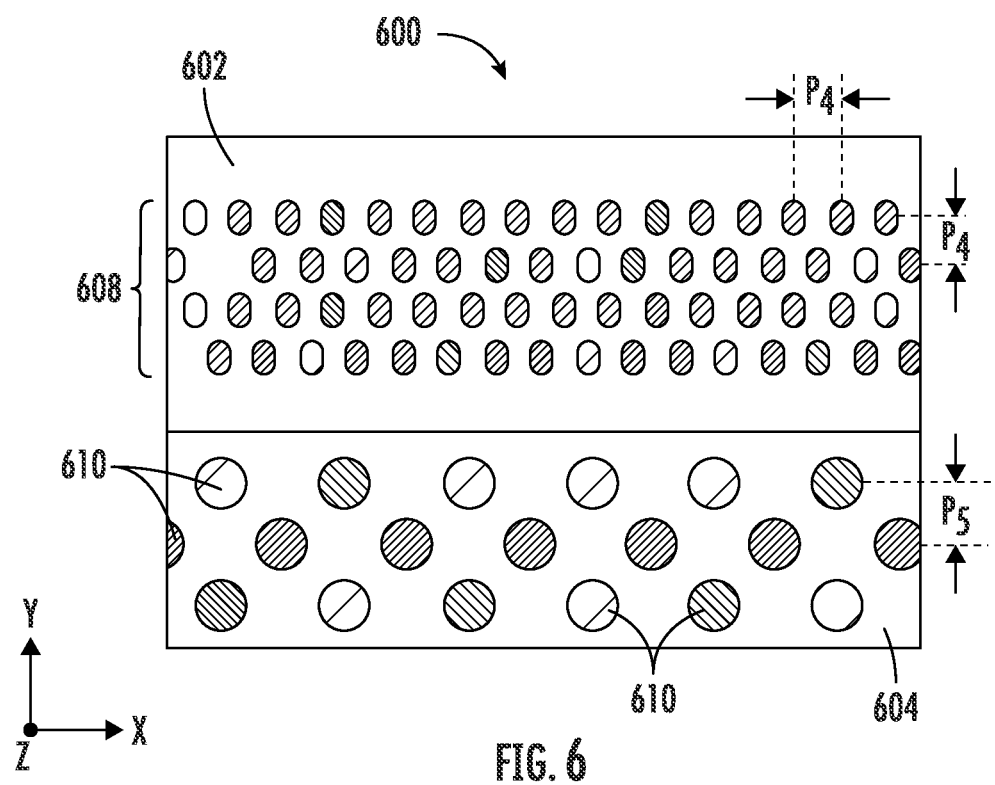
FIG. 6 is a top view of an exemplary IC package that includes a die that includes raised interconnect bumps coupling a die to a package substrate, and that does not include unraised interconnect bumps.
Figure 7:
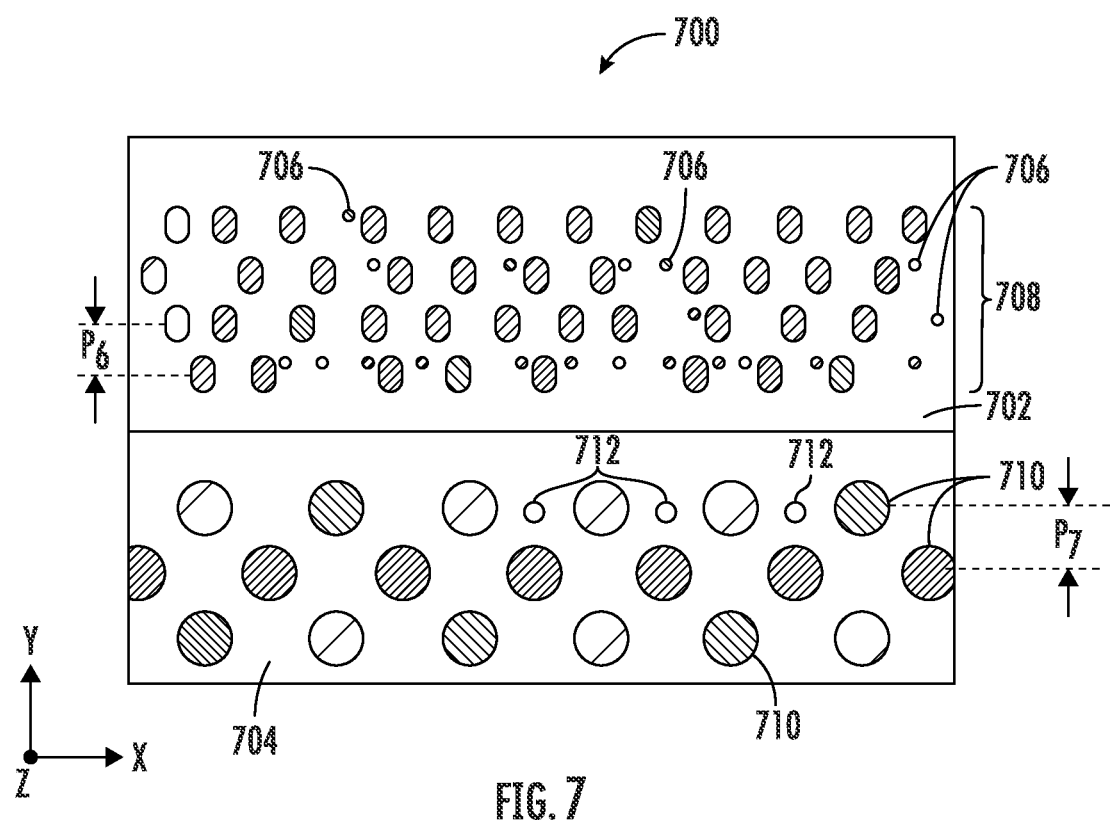
FIG. 7 is a top view of another exemplary IC package that includes a die that includes raised interconnect bumps coupling a die to a package substrate, and wherein the die includes a repurposed seed layer coupling a raised interconnect bump(s) to an unraised interconnect bump(s) to provide an additional signal path between the raised interconnect bump and a BEOL interconnect structure of the die.

To further illustrate the benefit of die having unraised interconnect bumps, FIGS. 6 and 7 are provided. FIG. 6 is a top view of an exemplary IC package 600 that includes a die 602 that includes raised interconnect bumps 608 coupling the die 602 to a package substrate 604. The die 602 does not include unraised interconnect bumps. The raised interconnect bumps 608 are formed at an interconnect bump pitch $P_4$ in the die 602. Other larger raised interconnect bumps 610, which may for example be used for power signal distribution for example, are formed at an interconnect bump pitch $P_5$ in the die 602. FIG. 7 is a top view of another exemplary package 700 that includes a die 702 that includes raised interconnect bumps 708 coupling the die 702 to a package substrate 704. The raised interconnect bumps 708 are formed at an interconnect bump pitch $P_6$ in the die 702 that is larger and relaxed from the interconnect bump pitch $P_4$ in the die 602 in FIG. 6. Other larger raised interconnect bumps 710 are formed in a section of the die 702 at an interconnect bump pitch $P_7$ that is larger than the interconnect bump pitch $P_5$ in the die 602 in FIG. 6. Raised interconnect bumps 710 may be employed for power signal distribution in a PDN in the die 702 as an example. The die 702 in FIG. 7 includes unraised interconnect bumps 706 that are formed from a repurposed seed layer(s) between adjacent raised interconnect bumps 708. The die 702 in FIG. 7 also includes unraised interconnect bumps 712 that are formed from a repurposed seed layer(s) between adjacent raised interconnect bumps 710. The ability to provide the unraised interconnect bumps 712 in the die 702 provides additional signal routing paths in the die 702. This may allow for a reduced number of interconnect bumps 708, 710 in the die 702 in FIG. 7 and/or at increased, relaxed respective interconnect bump pitches $P_6$, $P_7$.

Figure 8A:
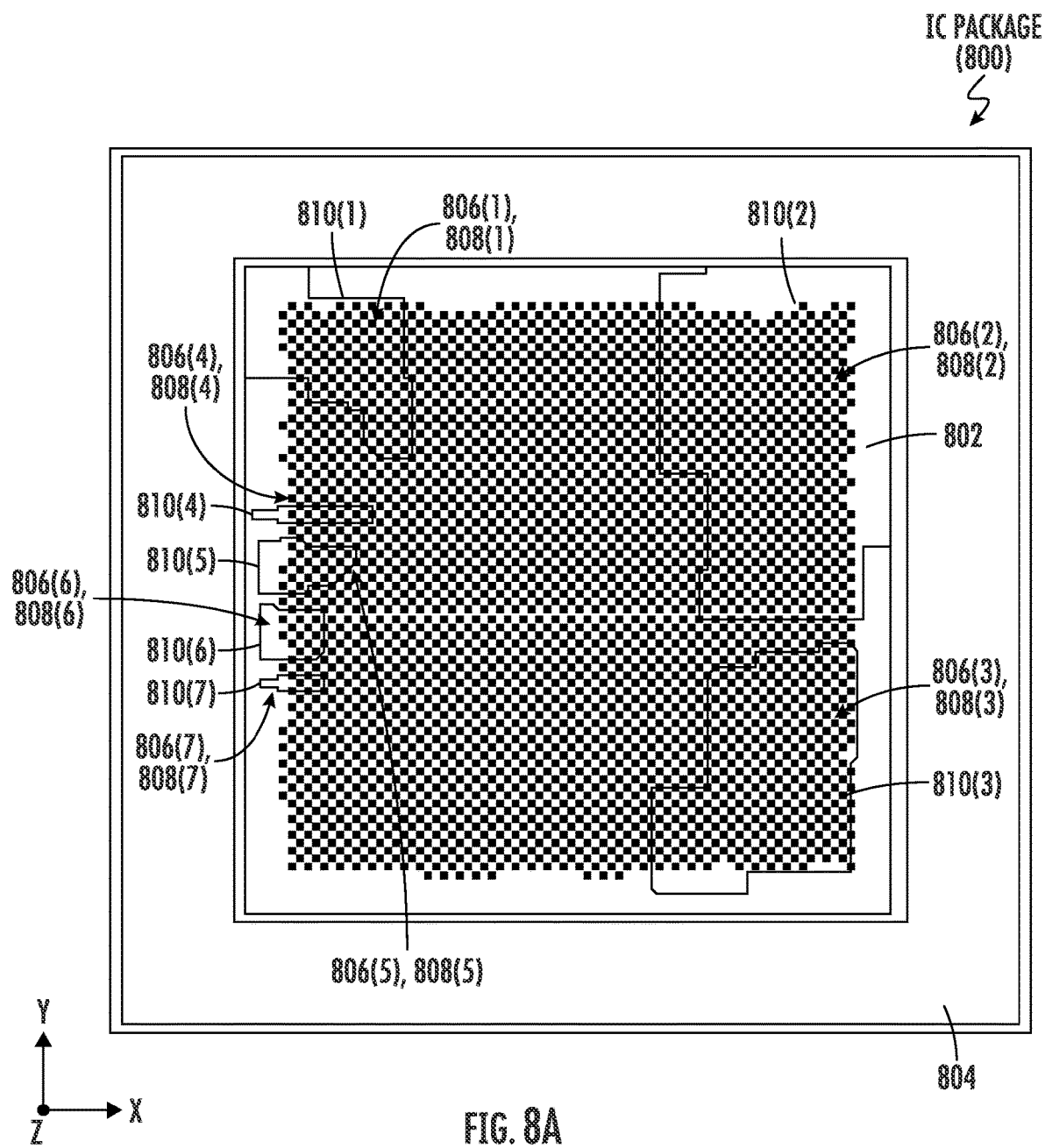
FIG. 8A is a top view of another exemplary IC package that includes raised interconnect bumps coupling a die to a package substrate, wherein the die includes areas that include multiple unraised interconnect bumps coupled to raised interconnect bumps.
Figure 8B:
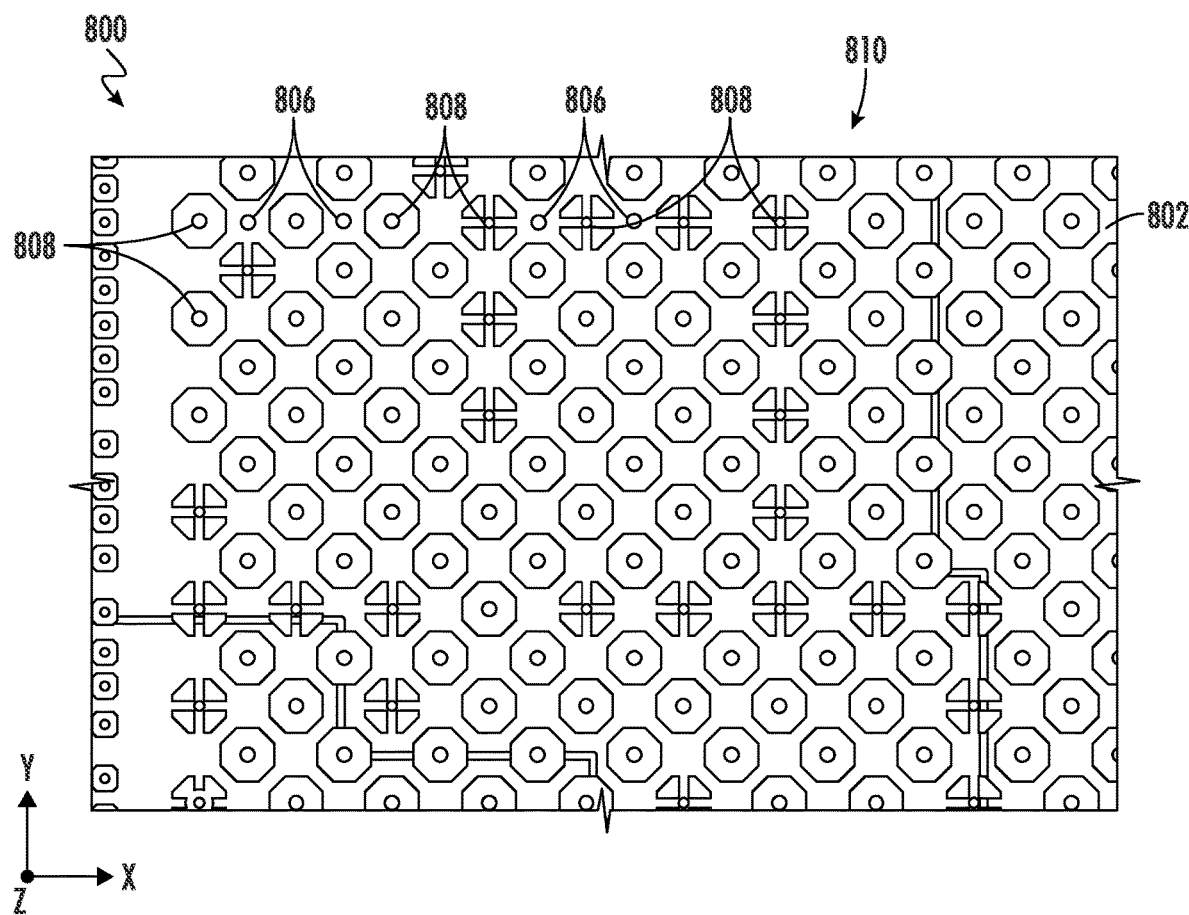
FIG. 8B is a close-up, bottom view of an area in the exemplary die in FIG. 8A.

FIG. 8A illustrates a top view of another IC package 800 that includes a die 802 disposed on a package substrate 804, wherein the die 802 includes areas 810(1)-810(7) that include respective clusters of unraised interconnect bumps 806(1)-806(7) that can be coupled to raised interconnect bumps 808(1)-808(7) in the respective areas 810(1)-810(7). For example, a larger number of raised interconnect bumps 808(1)-808(7) in a given area 810(1)-810(7) may be coupled together for grounding the die 802 to a ground plane in the package substrate 804. FIG. 8B is a close-up, bottom view of an area 810 in the exemplary die 802 in FIG. 8A. As shown therein, a plurality of raised interconnect bumps 808 are coupled together. Unraised interconnect bumps 806 are formed between adjacent interconnect bumps 808 and coupled to the raised interconnect bumps 808 to form additional signal routing paths between the die 802 and the package substrate 804.

Figure 9:
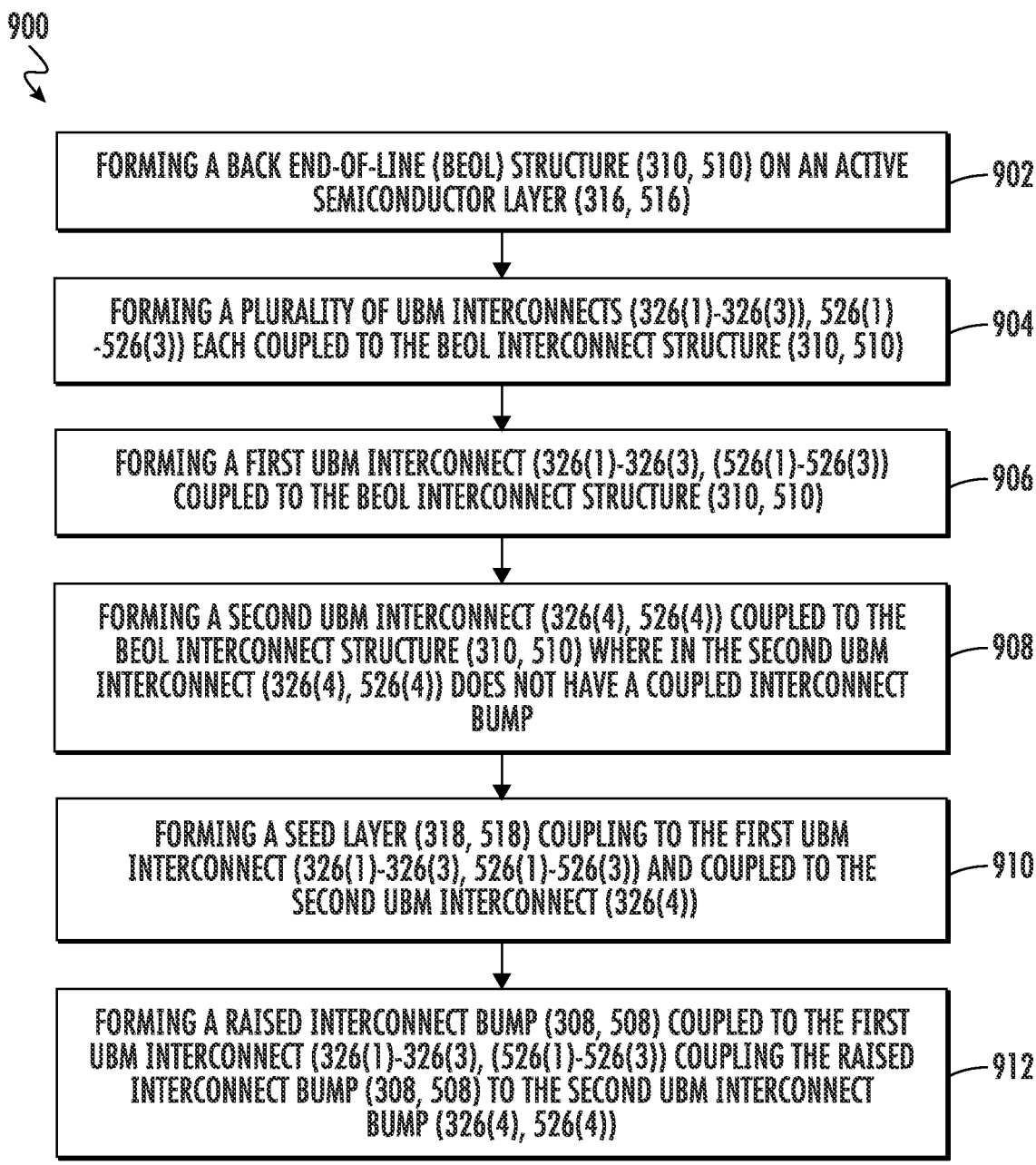
FIG. 9 is a flowchart illustrating an exemplary process of fabricating a die for an IC package, wherein the die includes a repurposed seed layer coupling a raised interconnect bump to an unraised interconnect bump, including, but not limited to, the dies in FIGS. 3A-8B.

FIG. 9 is a flowchart illustrating an exemplary fabrication process 900 of fabricating a die for an IC package, wherein the die includes a repurposed seed layer that forms an unraised interconnect bump coupled to a raised interconnect bump. For example, the fabrication process 900 in FIG. 9 can be used to fabricate the dies 302, 502 in FIG. 3A-3B and 5, respectively. The fabrication process 900 in FIG. 9 will be described in conjunction with the exemplary dies 302, 502 in FIG. 3A-3B and 5.

In this regard, as illustrated in FIG. 9, a first step in the fabrication process 900 can include forming a BEOL interconnect structure 310, 510 on an active semiconductor layer 316, 516. The BEOL interconnect structure 310, 510 comprises a BEOL metallization layer 312(1), 512(1) that includes a plurality of metal interconnects 314(1), 514(1) (block 902). A next step in the fabrication process 900 can include forming a plurality of UBM interconnects 326(1)-326(3), 526(1)-526(3) each coupled to a metal interconnect 314(1), 514(1) in the BEOL interconnect structure 310, 510 (block 904 in FIG. 9). A next step in the fabrication process 900 can include forming a first UBM interconnect 326(1)-326(3), 526(1)-526(3) among the plurality of UBM interconnects 326(1)-326(3), 526(1)-526(3) coupled to a metal interconnect 314(1), 514(1) in the BEOL interconnect structure 310, 510 (block 906 in FIG. 9). A next step in the fabrication process 900 can include forming a second UBM interconnect 326(4), 526(4) coupled to a metal interconnect 314(1), 514(1) in the BEOL interconnect structure 310, 510, wherein the second UBM interconnect 326(4), 526(4) does not have a coupled interconnect bump (block 908 in FIG. 9). The fabrication process 900 can also include forming a seed layer 318, 518 coupled to the first UBM interconnect 326 (1)-326(3), 526(1)-526(3) and coupled to the second UBM interconnect 326(4), 526(4), wherein the seed layer 318, 518 couples the first UBM interconnect 326(1)-326(3), 526(1)-526(3) to the second UBM interconnect bump 326(4), 526(4) (block 910 in FIG. 9). The fabrication process 900 can also include forming a raised interconnect bump 308, 508 coupled to the first UBM interconnect 326(1)-326(3), 526(1)-526(3) coupling the raised interconnect bump 308, 508 to the second UBM interconnect 326(4), 526(4) (block 912 in FIG. 9).

A die that includes a repurposed seed layer forming an unraised interconnect bump coupled to a raised interconnect bump, such as dies 302 and 502 in FIG. 3A-3B and 5, respectively, can be fabricated according to other processes. In this regard, FIGS. 10A-10C are a flowchart illustrating another exemplary fabrication process 1000 of fabricating a die for an IC package, wherein the die includes a repurposed seed layer forming an unraised interconnect bump coupled to a raised interconnect bump, including, but not limited to, the dies 302, 502, 602, 702, 802 in FIGS. 3A-8B. FIGS. 11A-11I illustrate exemplary fabrication stages 1100A-1100I of fabricating a die that includes a repurposed seed layer forming an unraised interconnect bump coupled to a raised interconnect bump according to the exemplary fabrication process 1000 in FIGS. 10A-10C. The fabrication process 1000 in FIGS. 10A-10C will be discussed in conjunction with the exemplary fabrication stages 1100A-1100I in FIGS. 11A-11I. The fabrication process 1000 and the fabrication stages 1100A-1100I are illustrated in reference to the die 302 in FIGS. 3A and 3B. However, note that the fabrication process 1000 and the fabrication stages 1100A-1100I could also be applicable to fabrication of the dies 502, 602, 702, and 802 in FIGS. 5-8B as well.

In this regard, as shown in the exemplary fabrication stage 1100A in FIG. 11A, a first step in the fabrication process 1000 can be to provide a BEOL interconnect structure 310 that includes the metallization layers 312 and the RDL 322 formed in the BEOL interconnect structure 310 (block 1002 in FIG. 10A). As shown in the exemplary fabrication stage 1100B in FIG. 11B, a next step in the fabrication process 1000 can be to form a passivation layer 334 and a second passivation layer 336 on the RDL 322 and to pattern the passivation layers 334, 336 to form recesses 328(2)-328(4) in the passivation layers 334, 336 above respective RDL interconnects 320(2)-320(3) in the RDL 322 (block 1004 in FIG. 10A). As shown in the exemplary fabrication stage 1100C in FIG. 11C, a next step in the fabrication process 1000 can be to form a UBM layer 324 over the passivation layers 334, 336 to prepare for the UBM interconnects 326(2)-326(3) (not shown) and a second UBM interconnect 326(4) (not shown) to be formed in the respective recesses 328(2)-328(4) to form the raised interconnect bumps 308(2), 308(3) and the unraised interconnect bump 306 (block 1006 in FIG. 10A).

As shown in the exemplary fabrication stage 1100D in FIG. 11D, a next step in the fabrication process 1000 can be to form the seed layer 318 on the UBM layer 324 and in the recesses 328(2)-328(4) to form the UBM interconnects 326(2), 326(3) and the second UBM interconnect 326(4) in the recesses 328(2)-328(4) in contact with the RDL interconnects 320(2)-320(4) (block 1008 in FIG. 10B). As shown in the exemplary fabrication stage 1100E in FIG. 11E, a next step in the fabrication process 1000 can be to form a photoresist layer 1102 on the seed layer 318 and pattern openings 1104(2), 1104(3) in the photoresist layer 1102 to prepare to form the raised metal interconnects 308(2), 308 (3) (FIG. 11F) (block 1010 in FIG. 10B). In this example, only openings 1104(2), 1104(3) are formed over the seed layer 318 for the UBM interconnects 326(2), 326(3), because a raised interconnect bump will not be formed in contact with the second UBM interconnect 326(4) that will form the unraised interconnect bump 306. The photoresist layer 1102 can be patterned in a lithography process to form openings 1104(2), 1104(3) each disposed in a vertical direction (Z-axis direction) exposing the seed layer 318 disposed in the recesses 328(2), 328(3). As illustrated in the exemplary fabrication stage 1100F in FIG. 11F, a next step in the fabrication process 1000 is to dispose a metal material 1106 in the plurality of openings 1104(2), 1104(3) in the photoresist layer 1102 to form the raised interconnect bumps 308(2), 308(3) coupled to the respective UBM interconnects 326(2), 326(3) (block 1012 in FIG. 10B). The portion of the seed layer 318 and the UBM layer 324 disposed in the recesses 328(2)-328(3) form the UBM interconnects 326(2), 326(3). The portion of the seed layer 318 and the UBM layer 324 disposed in the recess 328(4) forms the second UBM interconnect 326(4).

As illustrated in the exemplary fabrication stage 1100G in FIG. 11G, a next step in the fabrication process 1000 is to remove the photoresist layer 1102 and to dispose a second photoresist layer 1108 on the seed layer 318 that is exposed from the raised interconnect bumps 308(2), 308(3) to prepare select portions of the UBM layer 324 and seed layer 318 to be removed (e.g., etched away) (block 1014 in FIG. 10C). This is to prepare the UBM layer 324 and the seed layer 318 to be etched outside the recesses 328(2)-328(4). In this example, the portions of the UBM layer 324 and the seed layer 318 inside the recesses 328(2)-328(4) will not be etched and will be retained in the recesses 328(2)-328(4) to form the UBM interconnects 326(2), 326(3) and the second UBM interconnect 326(4). The UBM layer 324 and the seed layer 318 are etched to be repurposed to couple the second UBM interconnect 326(4) formed by the seed layer 318 in the recess 328(4) and without a coupled interconnect bump, to the UBM interconnect 326(2) (block 1014 in FIG. 10C). This couples the second UBM interconnect 326(4) without a coupled interconnect bump to the raised interconnect bump 308(2). As also shown in the exemplary fabrication stage 1100G in FIG. 11G, patterned openings 1110 are formed in the second photoresist layer 1108 disposed above the seed layer 318 where the portions of the seed layer 318 are to be removed. In this manner, as shown in the exemplary fabrication stage 1100H in FIG. 11H, the portions of the UBM layer 324 and seed layer 318 in the openings 1110 are removed (e.g., etched) to provide an open circuit between the second UBM interconnect 326(4) forming the unraised interconnect bump 306 and the raised interconnect bump 308(3) (block 1016 in FIG. 10C). The UBM layer 324 is split into three (3) separate UBM layers 324(1)-324(3) as a result of the etching into the openings 1110. The seed layer 318 is also split into three (3) separate seed layers 318(1)-318(3) as a result of the etching into the openings 1110. The portion of the seed layer 318(1) coupling the unraised interconnect bump 306 to the raised interconnect bump 308(2) is left resident by being blocked by the second photoresist layer 1108, thus repurposing this portion of the seed layer 318(1) to couple the unraised interconnect bump 306 to the raised interconnect bump 308(2). Then, as shown in the exemplary fabrication stage 1100I in FIG. 11I, the entire structure of the fabrication stage 1100F that includes the BEOL interconnect structure 310 with the raised interconnect bumps 308(2), 308(3) and the unraised interconnect bump 306 can then be reflowed to form the solder joints 332(2), 332(3) on the metal pillars 330(2), 330(3) of the raised interconnect bumps 308(2), 308(3) (block 1018 in FIG. 10C).

Figure 12:
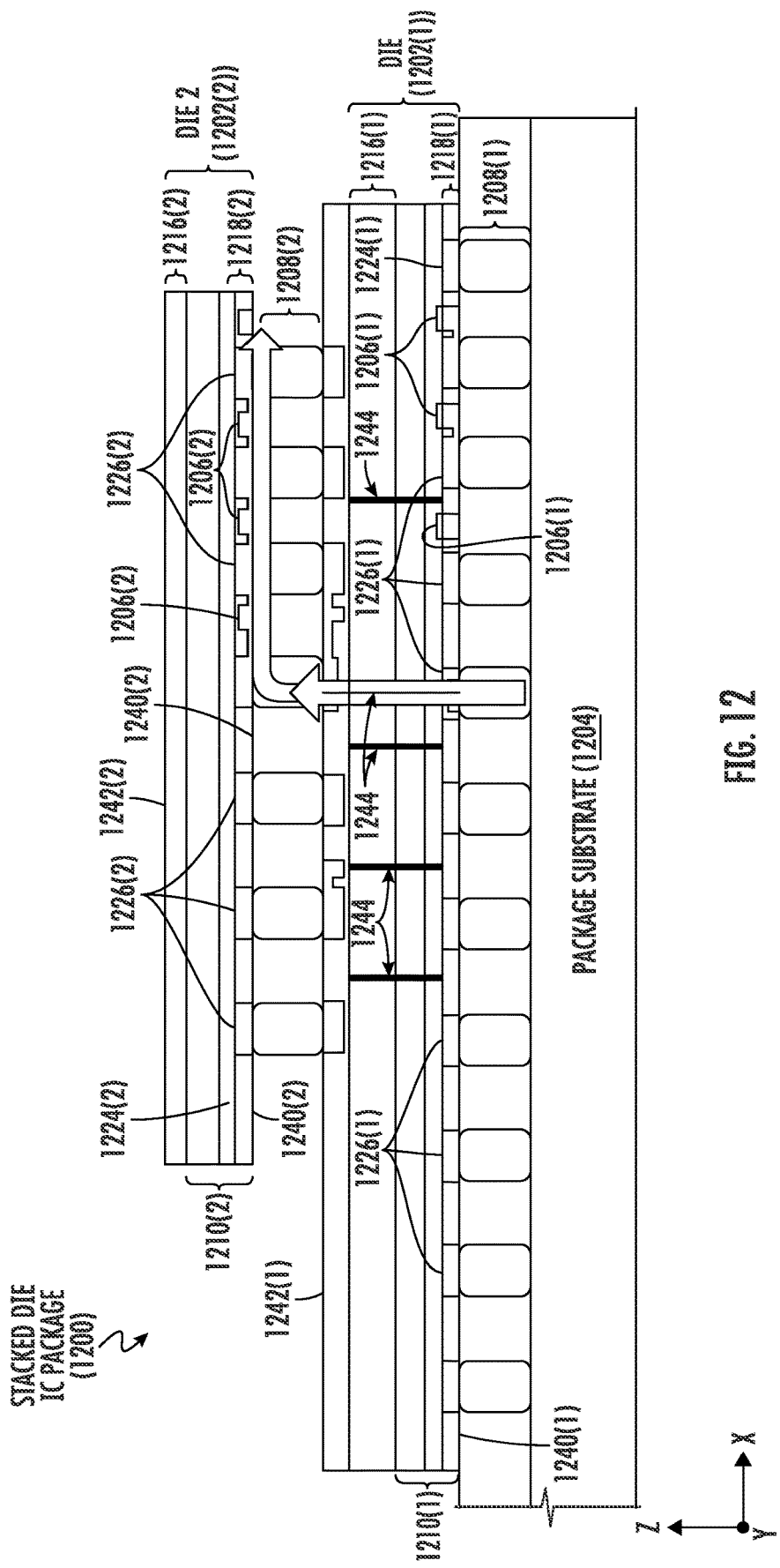
FIG. 12 is a side view of an exemplary stacked-die IC package that includes multiple stacked dies, wherein the dies include a repurposed seed layer coupling a raised interconnect bump to an unraised interconnect bump, including, but not limited to, the dies in FIGS. 3A-8B and 11A-11I.

It may also be desired to provide a repurposed seed layer to provide an unraised interconnect bump(s) in stacked dies in an IC package to facilitate an increased density of interconnects between stacked dies and/or between the stacked dies and a package substrate. In this regard, FIG. 12 is a side view of an exemplary stacked-die IC package 1200 that includes multiple stacked first and second dies 1202(1), 1202(2), wherein the first and second dies 1202(1), 1202(2) each include a repurposed seed layer 1218(1), 1218(2) similar to the repurposed seed layer 318, 518 in the dies 302, 502 in FIGS. 3A-3B and 5 to form an unraised interconnect bump coupled to one or more raised interconnect bumps. In this regard, as illustrated in FIG. 12, the stacked-die IC package 1200 includes a package substrate 1204, The first die 1202(1) is disposed above the package substrate 1204 in the vertical direction (Z-axis direction) and is coupled to the package substrate 1204 by raised interconnect bumps 1208(1). The second die 1202(2) is disposed above the first die 1202(1) in the vertical direction (Z-axis direction) and is coupled to the first die 1202(1) by raised interconnect bumps 1208(2).

The first die 1202(1) includes a first BEOL interconnect structure 1210(1) that includes a first RDL layer 1224(1) that includes UBM interconnects 1226(1). The BEOL interconnect structure 1210(1) is adjacent to a first active side 1240(1) of the first die 1202(1). An active semiconductor layer 1216(1) is coupled to the first BEOL interconnect structure 1210(1). The active semiconductor layer 1216(1) is adjacent to a first inactive side 1242(1) of the first die 1202(1). Note that the first inactive side 1242(1) of the first die 1202(1) could be facing downward in the vertical direction (Z-axis direction) in FIG. 12 instead of upward as shown. Raised interconnect bumps 1208(1) are formed in contact with the first die 1202(1). Unraised interconnect bumps 1206(1) are formed from a repurposed seed layer 1218(1) and are coupled to other raised interconnect bumps 1208(1). The second die 1202(2) includes a second BEOL interconnect structure 1210(2) adjacent to a second active side 1240(2) of the second die 1202(2). The second BEOL interconnect structure 1210(2) includes a second RDL layer 1224(2) that includes UBM interconnects 1226(2). An active semiconductor layer 1216(2) is coupled to the second BEOL interconnect structure 1210(2). The active semiconductor layer 1216(2) is adjacent to a second inactive side 1242(2) of the second die 1202(2). Raised interconnect bumps 1208(2) are formed in contact with respective UBM interconnects 1226(2). Unraised interconnect bumps 1206(2) are formed from a repurposed seed layer 1218(2) and are coupled to other raised interconnect bumps 1208(2). Vias 1244, such as a through-silica vias (TSVs), can be employed to provide direct connections from the second die 1202(2) to the package substrate 1204, through the first die 1202(1). The vias 1244 may be used, for example, to couple the PDNs of the first and second dies 1202(1), 1202(2) to their respective raised interconnect bumps 1208(1), 1208(2) and coupled unraised interconnect bumps 1206(1), 1206(2) dedicated for carrying signals. As one example, the unraised interconnect bumps 1206(1), 1206(2) may be useful in the stacked-die IC package 1200 in FIG. 12 if raised interconnect bumps 1208(1), 1208(2) that are used for power delivery are not directly over each other in the vertical direction (Z-axis direction). The unraised interconnect bumps 1206(1), 1206(2) can be used to provide flexibility in re-routing signals in a horizontal direction (X- or Y-axis directions). As another example, if the top die 1202(2) were to extend beyond the bottom die 1202(1) in the horizontal direction (X- or Y-axis direction), it would not be possible to directly couple a raised interconnect bump 1208(2) on the edge of the BEOL interconnect structure 1210(2) to a raised interconnect bump 1208(1) of the BEOL interconnect structure 1210(1) directly below. Thus, the unraised interconnect bumps 1206(2) in the top BEOL interconnect structure 1210(1) could be used to re-route signals horizontally to other raised interconnect bumps 1208(2) adjacent to the top BEOL interconnect structure 1210(2) to then be routed in a vertical direction (Z-axis direction) down to raised interconnect bumps 1208(1) adjacent to the bottom BEOL interconnect structure 1210(1).

Figure 13:
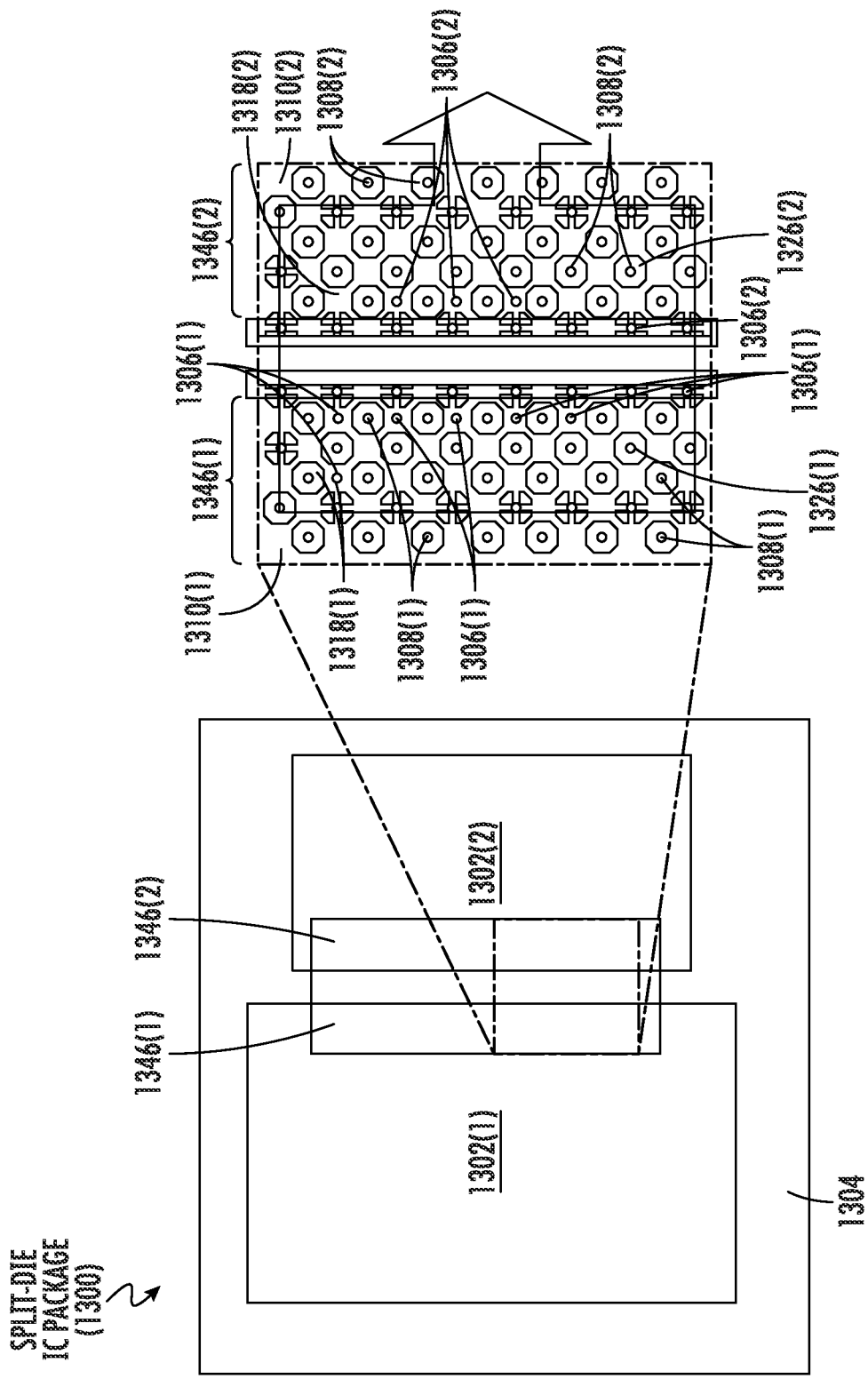
FIG. 13 is a top view of an exemplary split-die IC package that includes split dies coupled to a package substrate, wherein the dies include a repurposed seed layer coupling a raised interconnect bump to an unraised interconnect bump in a UBM layer of the dies, including, but not limited to, the dies in FIGS. 3A-8B and 11A-11I.

Dies that include repurposed seed layers for forming unraised interconnect bumps can also be put in a split-die IC package that includes split dies. In this regard, FIG. 13 is a top view of an exemplary split-die IC package 1300 that includes split dies 1302(1), 1302(2) coupled to a package substrate 1304. The first and second dies 1302(1), 1302(2) each include respective D2D bump interconnect areas 1346

(1), 1346(2) that include respective interconnect bumps 1308(1), 1308(2) that are coupled to each other through the package substrate 1304 to provide D2D connections between the first and second dies 1302(1), 1302(2). Each die 1302(1), 1302(2) can include UBM interconnects 1326(1), 1326(2) in respective BEOL interconnect structures 1310 (1), 1310(2) that support forming raised interconnect bumps 1308(1), 1308(2) and unraised interconnect bumps 1306(1), 1306(2) formed by a repurposed seed layer 1318(1), 1318 (2), such as shown in the dies 302, 502 in FIGS. 3A-3B and 5, as an example. Raised interconnect bumps 1308(1), 1308(2) in the respective D2D bump interconnect areas 1346(1), 1346(2) can be coupled to unraised interconnect bumps 1306(1), 1306(2) through the repurposed seed layers 1318(1), 1318(2), like shown in the dies 302, 502 in FIGS. 3A-3B and 5, as an example. Unraised interconnect bumps 1306(1), 1306(2) in the respective D2D bump interconnect areas 1346(1), 1346(2) can be coupled to each other through the package substrate 1304 to provide D2D connections.

Note that the terms "top" and "bottom" where used herein are relative terms and are not meant to limit or imply a strict orientation that a "top" referenced element must always be oriented to be above a "bottom" referenced element, and vice versa. Also, note that the terms "above" and "below" where used herein are relative terms and are not meant to limit or imply a strict orientation that an element referenced as being "above" another referenced element must always be oriented to be above the other referenced element with respect to ground, or that an element referenced as being "below" another referenced element must always be oriented to be below the other referenced element with respect to ground.

IC packages each employing a die(s) coupled to a package substrate, wherein the die(s) can include a repurposed seed layer coupling a raised interconnect bump to an unraised interconnect bump in a UBM layer of the die(s), including, but not limited, to the exemplary dies in FIGS. 3A-8B and 11A-13, and according to the exemplary fabrication processes in FIGS. 9-11F, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 14:
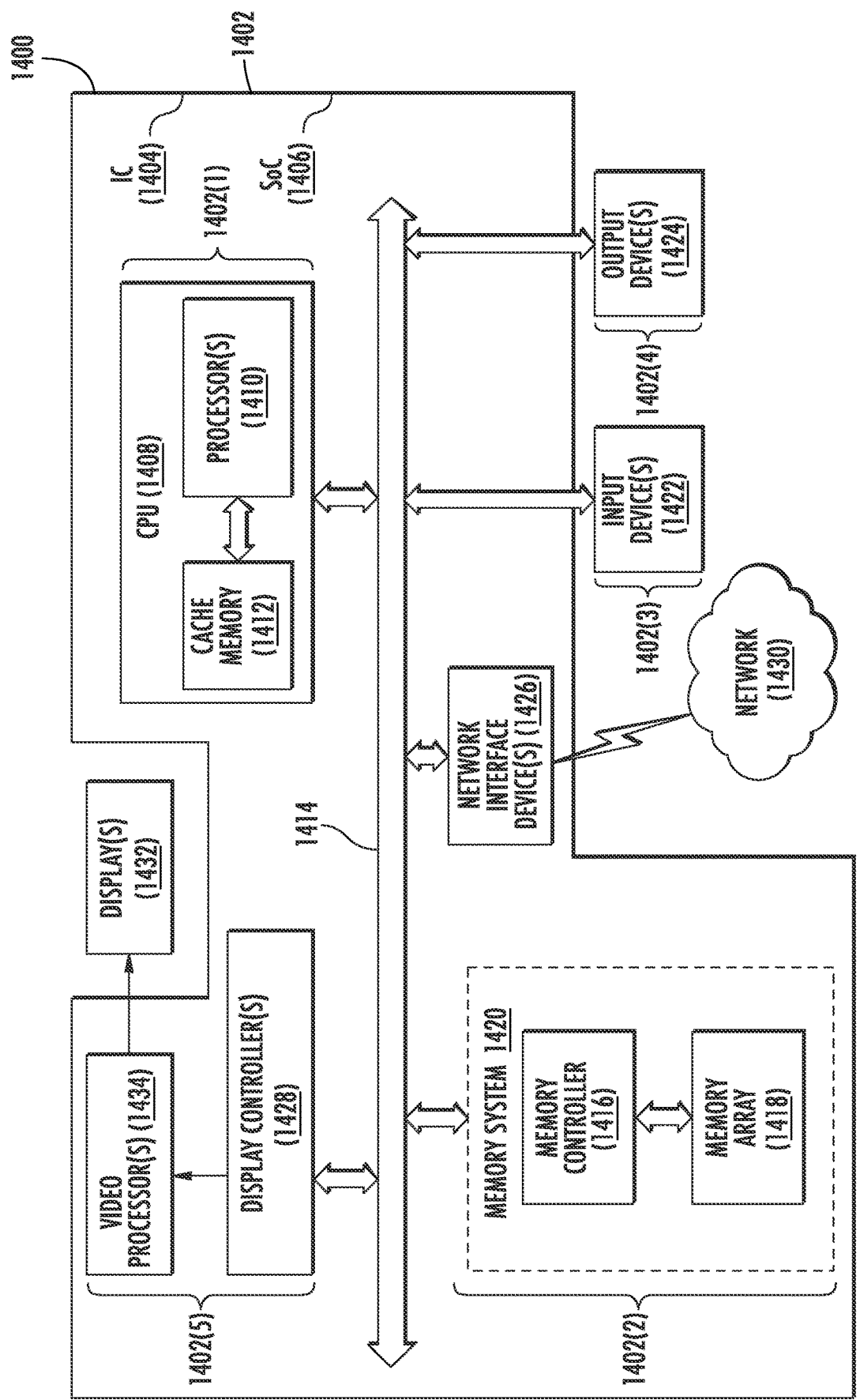
FIG. 14 is a block diagram of an exemplary processor-based system that can be provided in one or more IC packages each employing a die(s) coupled to a package substrate, wherein the die(s) can include a repurposed seed layer coupling a raised interconnect bump to an unraised interconnect bump, including, but not limited to, the exemplary dies in FIGS. 3A-8B and 11A-13, and according to the exemplary fabrication processes in FIGS. 9-11I.

In this regard, FIG. 14 illustrates an example of a processor-based system 1400 including a circuit that can be provided in one or more IC packages 1402(1)-1402(5) each employing a die(s) coupled to a package substrate, wherein the die(s) can include a repurposed seed layer coupling a raised interconnect bump to an unraised interconnect bump in a UBM layer of the die(s), including, but not limited to, the exemplary dies in FIGS. 3A-8B and 11A-13, and according to the exemplary fabrication processes in FIGS. 9-11F. In this example, the processor-based system 1400 may be formed as an IC 1404 in an IC package 1402 as a system-on-a-chip (SoC) 1406. The processor-based system 1400 includes a central processing unit (CPU) 1408 that includes one or more processors 1410, which may also be referred to as CPU cores or processor cores. The CPU 1408 may have cache memory 1412 coupled to the CPU 1408 for rapid access to temporarily stored data. The CPU 1408 is coupled to a system bus 1414 and can intercouple master and slave devices included in the processor-based system 1400. As is well known, the CPU 1408 communicates with these other devices by exchanging address, control, and data information over the system bus 1414. For example, the CPU 1408 can communicate bus transaction requests to a memory controller 1416 as an example of a slave device. Although not illustrated in FIG. 14, multiple system buses 1414 could be provided, wherein each system bus 1414 constitutes a different fabric.

Other master and slave devices can be connected to the system bus 1414. As illustrated in FIG. 14, these devices can include a memory system 1420 that includes the memory controller 1416 and a memory array(s) 1418, one or more input devices 1422, one or more output devices 1424, one or more network interface devices 1426, and one or more display controllers 1428, as examples. Each of the memory system 1420, the one or more input devices 1422, the one or more output devices 1424, the one or more network interface devices 1426, and the one or more display controllers 1428 can be provided in the same IC package) or different IC packages 1402(3), 1402(4). The input device(s) 1422 can include any type of input device, including, but not limited to, input keys, switches, voice processors, etc. The output device(s) 1424 can include any type of output device, including, but not limited to, audio, video, other visual indicators, etc. The network interface device(s) 1426 can be any device configured to allow exchange of data to and from a network 1430. The network 1430 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1426 can be configured to support any type of communications protocol desired.

The CPU 1408 may also be configured to access the display controller(s) 1428 over the system bus 1414 to control information sent to one or more displays 1432. The display controller(s) 1428 sends information to the display(s) 1432 to be displayed via one or more video processors 1434, which process the information to be displayed into a format suitable for the display(s) 1432. The display controller(s) 1428 and video processor(s) 1434 can be included as ICs in the same IC package 1402(5), and in the same or different IC package 1402, 1402(1) containing the CPU 1408 as an example. The display(s) 1432 can include any type of display, including but not limited to, a cathode ray tube (CRT), a liquid crystal display (LCD), a plasma display, a light emitting diode (LED) display, etc.

Figure 15:
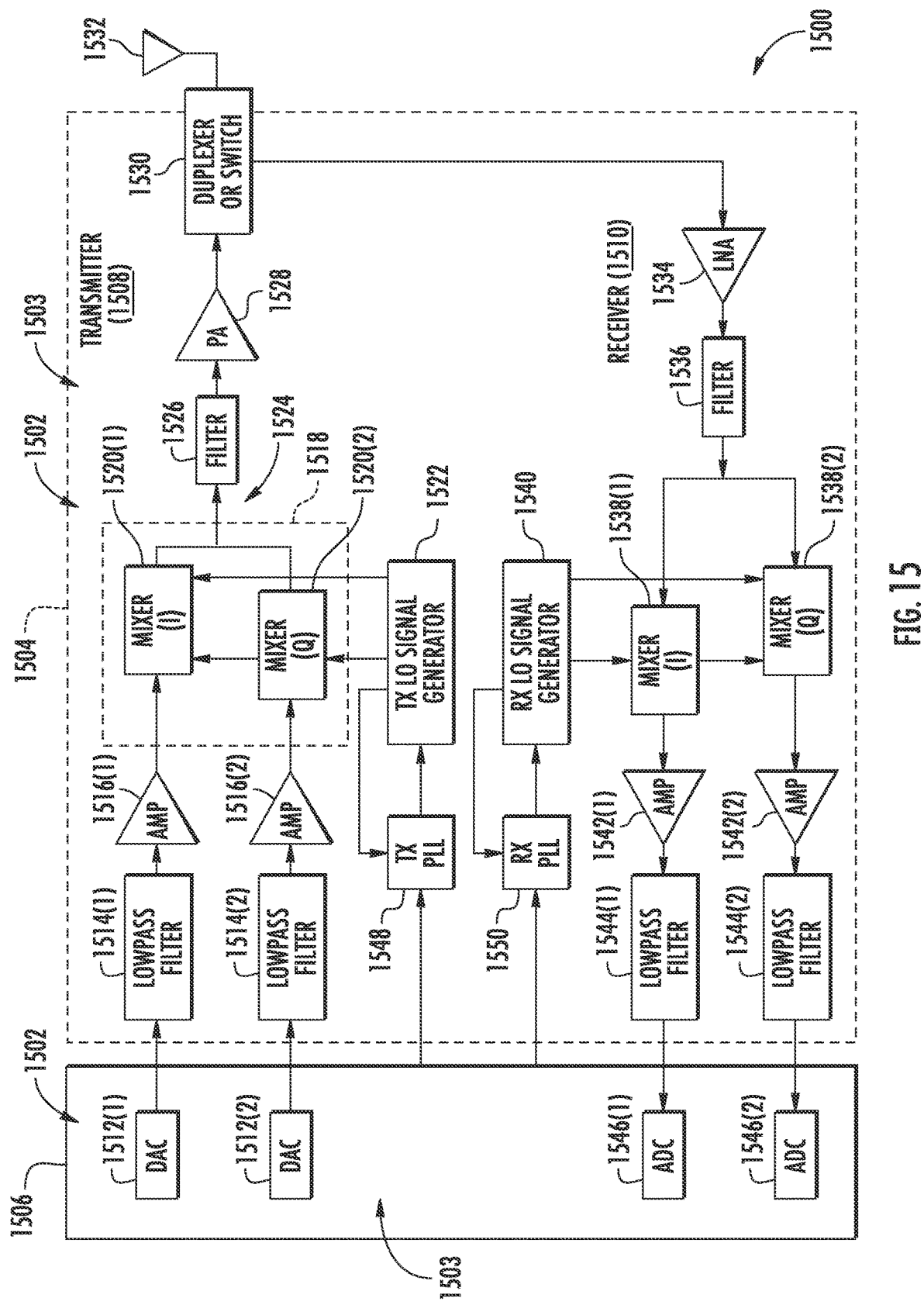
FIG. 15 is a block diagram of an exemplary wireless communications device that includes radio frequency (RF) components provided in one or more IC packages each employing a die(s) coupled to a package substrate, wherein the die(s) can include a repurposed seed layer coupling a raised interconnect bump to an unraised interconnect bump, including, but not limited to, the exemplary dies in FIGS. 3A-8B and 11A-13, and according to the exemplary fabrication processes in FIGS. 9-11I.

FIG. 15 illustrates an exemplary wireless communications device 1500 that includes radio frequency (RF) components formed from one or more ICs 1502, wherein any of the ICs 1502 can be included in an IC package 1503 employing a die(s) coupled to a package substrate, wherein the die(s) can include a repurposed seed layer coupling a raised interconnect bump to an unraised interconnect bump in a UBM layer of the die(s), including, but not limited to, the exemplary dies in FIGS. 3A-8B and 11A-13, and according to the exemplary fabrication processes in FIGS. 9-11F. The wireless communications device 1500 may include or be provided in any of the above-referenced devices, as examples. As shown in FIG. 15, the wireless communications device 1500 includes a transceiver 1504 and a data processor 1506. The data processor 1506 may include a memory to store data and program codes. The transceiver 1504 includes a transmitter 1508 and a receiver 1510 that support bi-directional communications. In general, the wireless communications device 1500 may include any number of transmitters 1508 and/or receivers 1510 for any number of communication systems and frequency bands. All or a portion of the transceiver 1504 may be implemented on one or more analog ICs, RF ICs (RFICs), mixed-signal ICs, etc.

The transmitter 1508 or the receiver 1510 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1510. In the direct-conversion architecture, a signal is frequency-converted between RF and baseband in one stage. The super-heterodyne and direct-conversion architectures may use different circuit blocks and/or have different requirements. In the wireless communications device 1500 in FIG. 15, the transmitter 1508 and the receiver 1510 are implemented with the direct-conversion architecture.

In the transmit path, the data processor 1506 processes data to be transmitted and provides I and Q analog output signals to the transmitter 1508. In the exemplary wireless communications device 1500, the data processor 1506 includes digital-to-analog converters (DACs) 1512(1), 1512(2) for converting digital signals generated by the data processor 1506 into the I and Q analog output signals, e.g., I and Q output currents, for further processing.

Within the transmitter 1508, lowpass filters 1514(1), 1514(2) filter the I and Q analog output signals, respectively, to remove undesired signals caused by the prior digital-to-analog conversion. Amplifiers (AMPs) 1516(1), 1516(2) amplify the signals from the lowpass filters 1514(1), 1514(2), respectively, and provide I and Q baseband signals. An upconverter 1518 upconverts the I and Q baseband signals with I and Q transmit (TX) local oscillator (LO) signals through mixers 1520(1), 1520(2) from a TX LO signal generator 1522 to provide an upconverted signal 1524. A filter 1526 filters the upconverted signal 1524 to remove undesired signals caused by the frequency up-conversion as well as noise in a receive frequency band. A power amplifier (PA) 1528 amplifies the upconverted signal 1524 from the filter 1526 to obtain the desired output power level and provides a transmit RF signal. The transmit RF signal is routed through a duplexer or switch 1530 and transmitted via an antenna 1532.

In the receive path, the antenna 1532 receives signals transmitted by base stations and provides a received RF signal, which is routed through the duplexer or switch 1530 and provided to a low noise amplifier (LNA) 1534. The duplexer or switch 1530 is designed to operate with a specific receive (RX)-to-TX duplexer frequency separation, such that RX signals are isolated from TX signals. The received RF signal is amplified by the LNA 1534 and filtered by a filter 1536 to obtain a desired RF input signal. Down-conversion mixers 1538(1), 1538(2) mix the output of the filter 1536 with I and Q RX LO signals (i.e., LO_I and LO_Q) from an RX LO signal generator 1540 to generate I and Q baseband signals. The I and Q baseband signals are amplified by AMPs 1542(1), 1542(2) and further filtered by lowpass filters 1544(1), 1544(2) to obtain I and Q analog input signals, which are provided to the data processor 1506. In this example, the data processor 1506 includes analog-to-digital converters (ADCs) 1546(1), 1546(2) for converting the analog input signals into digital signals to be further processed by the data processor 1506.

In the wireless communications device 1500 of FIG. 15, the TX LO signal generator 1522 generates the I and Q TX LO signals used for frequency up-conversion, while the RX LO signal generator 1540 generates the I and Q RX LO signals used for frequency down-conversion. Each LO signal is a periodic signal with a particular fundamental frequency. A TX phase-locked loop (PLL) circuit 1548 receives timing information from the data processor 1506 and generates a control signal used to adjust the frequency and/or phase of the TX LO signals from the TX LO signal generator 1522. Similarly, an RX PLL circuit 1550 receives timing information from the data processor 1506 and generates a control signal used to adjust the frequency and/or phase of the RX LO signals from the RX LO signal generator 1540.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered clauses:

1. An integrated circuit (IC) package, comprising:
   a die, comprising:
      a back end-of-line (BEOL) interconnect structure;
      a plurality of under bump metallization (UBM) interconnects each coupled to the BEOL interconnect structure, the plurality of UBM interconnects comprising:
         a first UBM interconnect; and
         a second UBM interconnect that does not have a coupled interconnect bump; and
      a raised interconnect bump coupled to the first UBM interconnect;
      wherein the die further comprises:
         a seed layer coupling the first UBM interconnect to the second UBM interconnect, to couple the raised interconnect bump to the second UBM interconnect.
2. The IC package of clause 1, wherein the seed layer further comprises the first UBM interconnect and the second UBM interconnect.
3. The IC package of any of clauses 1-2, wherein the BEOL interconnect structure comprises a metallization layer comprising:
   a plurality of first metal interconnects each coupled to a UBM interconnect among the plurality of UBM interconnects; and
   a second metal interconnect coupled to the second UBM interconnect.
4. The IC package of clause 3, wherein the metallization layer comprises a. redistribution layer (RDL) comprising a plurality of first RDL interconnects and a second RDL interconnect;
   the plurality of first metal interconnects comprises the plurality of first RDL interconnects, each coupled to a UBM interconnect among the plurality of UBM interconnects; and
   the second metal interconnect comprises the second RDL interconnect.
5. The IC package of clause 3, wherein the plurality of first metal interconnects comprises a plurality of metal pads.
6. The IC package of any of clauses 1-5, wherein the plurality of UBM interconnects further comprises a third UBM interconnect; and
   further comprising a second raised interconnect bump coupled to the second UBM interconnect;
   wherein the seed layer couples the third UBM interconnect to the second UBM interconnect, to couple the second raised interconnect bump to the second UBM interconnect and the raised interconnect bump.
7. The IC package of any of clauses 1-6, wherein:
   the plurality of UBM interconnects have an interconnect bump pitch; and
   the second UBM interconnect is located a distance in a horizontal direction from the coupled raised interconnect bump less than the interconnect bump pitch.
8. The IC package of any of clauses 1-6, wherein:
   the plurality of UBM interconnects have an interconnect bump pitch; and
   the second UBM interconnect is located a distance in a horizontal direction from the coupled raised interconnect bump greater than the interconnect bump pitch.
9. The IC package of any of clauses 1-8, wherein the die further comprises a power distribution network, comprising:
   a ground plane in the BEOL interconnect structure; and
   a positive supply rail in the BEOL interconnect structure.
10. The IC package of clause 9, wherein the second UBM interconnect is coupled to the ground plane of the power distribution network to couple the second UBM interconnect to the ground plane.
11. The IC package of clause 9, wherein the second UBM interconnect is coupled to the positive supply rail of the power distribution network to couple the second UBM interconnect to the positive supply rail.
12. The IC package of clause 9, wherein the die further comprises an input/output (I/O) signal node configured carry an I/O signal;
   the second UBM interconnect is coupled to an I/O signal node.
13. The IC package of any of clauses 1-12, wherein the die further comprises a front end-of-line (FEOL) structure comprising a semiconductor device;
   the second UBM interconnect is coupled to the semiconductor device through the BEM interconnect structure.
14. The IC package of any of clauses 1-13, further comprising:
   a package substrate;
   the die coupled to the package substrate; and
   a second die, comprising:
      a second BEOL interconnect structure;
      a plurality of second UBM interconnects each coupled to the second BEOL interconnect structure the plurality of second UBM interconnects comprising:
         a third UBM interconnect; and
         a fourth UBM interconnect that does not have a coupled interconnect bump;
      a second raised interconnect bump coupled to the third UBM interconnect; and a second seed layer coupling the fourth UBM interconnect to the third UBM interconnect, to couple the second raised interconnect bump to the fourth UBM interconnect;
the second UBM interconnect coupled to the fourth UBM interconnect.
15. The IC package of clause 14, wherein:
the die further comprises a first active side and a first inactive side;
the second die further comprises a second active side and a second inactive side;
the first active side of the die is coupled to the package substrate; and
the second active side of the second die is coupled to the first inactive side of the die.
16. The IC package of clause 15, wherein:
the die further comprises a vertical interconnect access (via);
the second UBM interconnect is coupled to the via; and
the fourth UBM interconnect is coupled to the via.
17. The IC package of clause 14, wherein:
the die is coupled to the package substrate adjacent to the second die in a horizontal direction.
the die comprises a first die-to-die (D2D) bump interconnect area comprising a UBM layer; and
the second die comprises a second D2D bump interconnect area comprising a second UBM layer.
18. The IC package of any of clauses 1-17 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.
19. A method of fabricating a semiconductor wafer, comprising:
forming a back end-of-line (BEOL) interconnect structure on a semiconductor layer;
forming a plurality of under bump metallization (UBM) interconnects each coupled to the BEOL interconnect structure, comprising:
forming a first UBM interconnect coupled to the BEOL interconnect structure; and
forming a second UBM interconnect coupled to the BEOL interconnect structure, wherein the second UBM interconnect does not have a coupled interconnect bump;
forming a seed layer coupling the first UBM interconnect to the second UBM interconnect; and
forming a raised interconnect bump coupled to the first UBM interconnect coupling the raised interconnect bump to the second UBM interconnect.
20. The method of clause 19, comprising:
forming the plurality of UBM interconnects at an interconnect bump pitch; and
forming the second UBM interconnect at a distance in a horizontal direction from the coupled raised interconnect bump less than the interconnect bump pitch.
21. The method of clause 19, comprising:
forming the plurality of UBM interconnects at an interconnect bump pitch; and
forming the second UBM interconnect at a distance in a horizontal direction from the coupled raised interconnect bump greater than the interconnect bump pitch.
22. The method of any of clauses 19-21, wherein:
forming the BEOL interconnect structure comprises forming at least one BEOL metallization layer each comprising a plurality of metal interconnects;
forming the plurality of UBM interconnects further comprises coupling each of the plurality of UBM interconnects to a metal interconnect among the plurality of metal interconnects in a BEOL metallization layer of the at least one BEOL metallization layer; and
forming the second UBM interconnect further comprises coupling to the second UBM interconnect to a second metal interconnect among the plurality of metal interconnects in the BEOL metallization layer.
23. The method of clause 22, wherein the BEOL, interconnect structure comprises a redistribution layer (RDL) comprising a plurality of RDL interconnects;
wherein:
coupling each of the plurality of UBM interconnects comprises coupling each of the plurality of UBM interconnects to a RDL interconnect among the plurality of RDL interconnects in the RDL; and
coupling the second UBM interconnect comprises coupling the second UBM interconnect to a second RDL interconnect among the plurality of RDL interconnects.
24. The method of any of clauses 22-23, further comprising forming a passivation layer adjacent to the BEOL interconnect structure.
25. The method of clause 24, further comprising forming a plurality of recesses in the passivation layer each adjacent to a metal interconnect among the plurality of metal interconnects in the BEOL metallization layer.
26. The method of clause 25, further comprising:
disposing a UBM layer over the passivation layer and inside each of the plurality of recesses such that the UBM layer is coupled to the plurality of metal interconnects adjacent to the plurality of recesses;
wherein:
a portion of the UBM layer inside a first recess among the plurality of recesses form at least a portion of the first UBM interconnect; and
a portion of the UBM layer inside a second recess among the plurality of recesses forms at least a portion of the second UBM interconnect.
27. The method of any of clauses 25-26, further comprising disposing a seed layer adjacent to the passivation layer and inside each of the plurality of recesses such that the seed layer is coupled to the plurality of metal interconnects adjacent to the plurality of recesses;
wherein:
portions of the seed layer inside a first plurality of recesses among the plurality of recesses form at least a portion of the plurality of UBM interconnects;
a portion of the seed layer inside a first recess among the plurality of recesses forms at least a portion of the first UBM interconnect; and
a portion of the seed layer inside a second recess among the plurality of recesses forms at least a portion of the second UBM interconnect.

28. The method of clause 27, further comprising:
  forming a photoresist layer on the seed layer;
  patterning the photoresist layer to form a plurality of openings each disposed above a respective recess among the plurality of recesses in a vertical direction;
  disposing a metal material in an opening among the plurality of openings in the photoresist layer to form the raised interconnect bump coupled to the seed layer in a first recess among the plurality of recesses; and
  removing the photoresist layer.
29. The method of clause 28, further comprising:
  forming a second photoresist layer on the seed layer and the raised interconnect bump;
  patterning the second photoresist layer to form a second opening adjacent to the second recess in a horizontal direction and not between the first recess and the second recess;
  removing the seed layer in the second opening;
  not removing the seed layer coupling the first UBM interconnect in the first recess and the second UBM interconnect in the second recess; and
  removing the second photoresist layer.
30. The method of clause 29, further comprising reflowing the BEOL interconnect structure to form a solder bump on the raised interconnect bump.

What is claimed is:
1. An integrated circuit (IC) package, comprising:
  a die, comprising:
    a back end-of-line (BEOL) interconnect structure;
    a plurality of under bump metallization (UBM) interconnects each coupled to the BEOL interconnect structure, the plurality of UBM interconnects comprising:
      a first UBM interconnect; and
      a second UBM interconnect that does not have a coupled interconnect bump; and
    a raised interconnect bump coupled to the first UBM interconnect;
    wherein the die further comprises:
      a seed layer coupling the first UBM interconnect to the second UBM interconnect, to couple the raised interconnect bump to the second UBM interconnect;
    wherein the BEOL interconnect structure comprises a metallization layer comprising:
      a plurality of first metal interconnects comprising a plurality of metal pads, each of the plurality of first metal interconnects coupled to a UBM interconnect among the plurality of UBM interconnects; and
      a second metal interconnect coupled to the second UBM interconnect.
2. The IC package of claim 1, wherein the seed layer further comprises the first UBM interconnect and the second UBM interconnect.
3. The IC package of claim 1, wherein the metallization layer comprises a redistribution layer (RDL) comprising a plurality of first RDL interconnects and a second RDL interconnect;
  the plurality of first metal interconnects comprises the plurality of first RDL interconnects, each coupled to a UBM interconnect among the plurality of UBM interconnects; and
  the second metal interconnect comprises the second RDL interconnect.
4. The IC package of claim 1, wherein the plurality of UBM interconnects further comprises a third UBM interconnect; and
  further comprising a second raised interconnect bump coupled to the second UBM interconnect;
  wherein the seed layer couples the third UBM interconnect to the second UBM interconnect, to couple the second raised interconnect bump to the second UBM interconnect and the raised interconnect bump.
5. The IC package of claim 1, wherein:
  the plurality of UBM interconnects have an interconnect bump pitch; and
  the second UBM interconnect is located a distance in a horizontal direction from the coupled raised interconnect bump less than the interconnect bump pitch.
6. The IC package of claim 1, wherein:
  the plurality of UBM interconnects have an interconnect bump pitch; and
  the second UBM interconnect is located a distance in a horizontal direction from the coupled raised interconnect bump greater than the interconnect bump pitch.
7. The IC package of claim 1, wherein the die further comprises a power distribution network, comprising:
  a ground plane in the BEOL interconnect structure; and
  a positive supply rail in the BEOL interconnect structure.
8. The IC package of claim 7, wherein the second UBM interconnect is coupled to the ground plane of the power distribution network to couple the second UBM interconnect to the ground plane.
9. The IC package of claim 7, wherein the second UBM interconnect is coupled to the positive supply rail of the power distribution network to couple the second UBM interconnect to the positive supply rail.
10. The IC package of claim 7, wherein the die further comprises an input/output (I/O) signal node configured carry an I/O signal;
  the second UBM interconnect is coupled to an I/O signal node.
11. The IC package of claim 1, wherein the die further comprises a front end-of-line (FEOL) structure comprising a semiconductor device;
  the second UBM interconnect is coupled to the semiconductor device through the BEOL interconnect structure.
12. The IC package of claim 1, further comprising:
  a package substrate;
  the die coupled to the package substrate; and
  a second die, comprising:
    a second BEOL interconnect structure;
    a plurality of second UBM interconnects each coupled to the second BEOL interconnect structure the plurality of second UBM interconnects comprising:
      a third UBM interconnect; and
      a fourth UBM interconnect that does not have a coupled interconnect bump;
    a second raised interconnect bump coupled to the third UBM interconnect; and
    a second seed layer coupling the fourth UBM interconnect to the third UBM interconnect, to couple the second raised interconnect bump to the fourth UBM interconnect;
  the second UBM interconnect coupled to the fourth UBM interconnect.
13. The IC package of claim 12, wherein:
  the die further comprises a first active side and a first inactive side;
  the second die further comprises a second active side and a second inactive side;
  the first active side of the die is coupled to the package substrate; and the second active side of the second die is coupled to the first inactive side of the die.

14. The IC package of claim 13, wherein:
the die further comprises a vertical interconnect access (via);
the second UBM interconnect is coupled to the via; and
the fourth UBM interconnect is coupled to the via.

15. The IC package of claim 12, wherein:
the die is coupled to the package substrate adjacent to the second die in a horizontal direction;
the die comprises a first die-to-die (D2D) bump interconnect area comprising a UBM layer; and
the second die comprises a second D2D bump interconnect area comprising a second UBM layer.

16. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of fabricating a semiconductor wafer, comprising:
forming a back end-of-line (BEOL) interconnect structure on a semiconductor layer;
forming a plurality of under bump metallization (UBM) interconnects each coupled to the BEOL interconnect structure, comprising:
forming a first under bump metallization (UBM) interconnect coupled to the BEOL interconnect structure; and
forming a second UBM interconnect coupled to the BEOL interconnect structure, wherein the second UBM interconnect does not have a coupled interconnect bump;
forming a seed layer coupling the first UBM interconnect to the second UBM interconnect; and
forming a raised interconnect bump coupled to the first UBM interconnect coupling the raised interconnect bump to the second UBM interconnect;
wherein the BEOL interconnect structure comprises a metallization layer comprising:
a plurality of first metal interconnects comprising a plurality of metal pads, each of the plurality of first metal interconnects coupled to a UBM interconnect among the plurality of UBM interconnects; and
a second metal interconnect coupled to the second UBM interconnect.

18. The method of claim 17, comprising:
forming the plurality of UBM interconnects at an interconnect bump pitch; and
forming the second UBM interconnect at a distance in a horizontal direction from the coupled raised interconnect bump less than the interconnect bump pitch.

19. The method of claim 17, comprising:
forming the plurality of UBM interconnects at an interconnect bump pitch; and
forming the second UBM interconnect at a distance in a horizontal direction from the coupled raised interconnect bump greater than the interconnect bump pitch.

20. The method of claim 17, wherein the BEOL interconnect structure comprises a redistribution layer (RDL) comprising a plurality of RDL interconnects;
wherein:
coupling each of the plurality of UBM interconnects comprises coupling each of the plurality of UBM interconnects to a RDL interconnect among the plurality of RDL interconnects in the RDL; and
coupling the second UBM interconnect comprises coupling the second UBM interconnect to a second RDL interconnect among the plurality of RDL interconnects.

21. The method of claim 17, further comprising forming a passivation layer adjacent to the BEOL interconnect structure.

22. The method of claim 21, further comprising forming a plurality of recesses in the passivation layer each adjacent to a metal interconnect among the plurality of metal interconnects in the BEOL metallization layer.

23. The method of claim 22, further comprising:
disposing a UBM layer over the passivation layer and inside each of the plurality of recesses such that the UBM layer is coupled to the plurality of metal interconnects adjacent to the plurality of recesses;
wherein:
a portion of the UBM layer inside a first recess among the plurality of recesses form at least a portion of the first UBM interconnect; and
a portion of the UBM layer inside a second recess among the plurality of recesses forms at least a portion of the second UBM interconnect.

24. The method of claim 22, further comprising disposing a seed layer adjacent to the passivation layer and inside each of the plurality of recesses such that the seed layer is coupled to the plurality of metal interconnects adjacent to the plurality of recesses;
wherein:
portions of the seed layer inside a first plurality of recesses among the plurality of recesses form at least a portion of the plurality of UBM interconnects;
a portion of the seed layer inside a first recess among the plurality of recesses forms at least a portion of the first UBM interconnect; and
a portion of the seed layer inside a second recess among the plurality of recesses forms at least a portion of the second UBM interconnect.

25. The method of claim 24, further comprising:
forming a photoresist layer on the seed layer;
patterning the photoresist layer to form a plurality of openings each disposed above a respective recess among the plurality of recesses in a vertical direction;
disposing a metal material in an opening among the plurality of openings in the photoresist layer to form the raised interconnect bump coupled to the seed layer in a first recess among the plurality of recesses; and
removing the photoresist layer.

26. The method of claim 25, further comprising:
forming a second photoresist layer on the seed layer and the raised interconnect bump;
patterning the second photoresist layer to form a second opening adjacent to the second recess in a horizontal direction and not between the first recess and the second recess;
removing the seed layer in the second opening;

not removing the seed layer coupling the first UBM interconnect in the first recess and the second UBM interconnect in the second recess; and removing the second photoresist layer.

27. The method of claim 26, further comprising reflowing the BEOL interconnect structure to form a solder bump on the raised interconnect bump.

28. An integrated circuit (IC) package, comprising:
a die, comprising:
   a metallization layer comprising:
      a plurality of first metal interconnects comprising a plurality of metal pads, the plurality of first metal interconnects each coupled to a UBM interconnect among the plurality of UBM interconnects; and
      a second metal interconnect coupled to the second UBM interconnect;
   a plurality of under bump metallization (UBM) interconnects each coupled to the metallization layer, the plurality of UBM interconnects comprising:
      a first UBM interconnect; and
      a second UBM interconnect that does not have a coupled interconnect bump; and
a raised interconnect bump coupled to the first UBM interconnect;
wherein the die further comprises:
   a seed layer coupling the first UBM interconnect to the second UBM interconnect, to couple the raised interconnect bump to the second UBM interconnect.

29. The IC package of claim 28, wherein:
the plurality of UBM interconnects have an interconnect bump pitch; and
the second UBM interconnect is located a distance in a horizontal direction from the coupled raised interconnect bump less than the interconnect bump pitch.

* * * * *